United States Patent
Perego et al.

(10) Patent No.: US 7,369,444 B2
(45) Date of Patent: May 6, 2008

(54) EARLY READ AFTER WRITE OPERATION MEMORY DEVICE, SYSTEM AND METHOD

(75) Inventors: Richard E. Perego, San Jose, CA (US); Frederick A. Ware, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/434,695

(22) Filed: May 16, 2006

(65) Prior Publication Data

US 2006/0203532 A1 Sep. 14, 2006

Related U.S. Application Data

(63) Continuation of application No. 10/353,405, filed on Jan. 29, 2003, now Pat. No. 7,187,572.

(60) Provisional application No. 60/392,198, filed on Jun. 28, 2002, provisional application No. 60/392,197, filed on Jun. 28, 2002.

(51) Int. Cl.
 *G11C 7/00* (2006.01)

(52) U.S. Cl. .......................... 365/189.01; 365/230.03; 365/233

(58) Field of Classification Search ............ 365/230.03, 365/233, 189.01
See application file for complete search history.

(56) References Cited

U.S. PATENT DOCUMENTS

| | | |
|---|---|---|
| 4,184,051 A | 1/1980 | Clingenpeel |
| 5,185,863 A | 2/1993 | Hamstra |
| 5,245,572 A | 9/1993 | Kosonocky et al. |
| 5,361,343 A | 11/1994 | Kosonocky et al. |

(Continued)

FOREIGN PATENT DOCUMENTS

EP 0430051 6/1991

(Continued)

OTHER PUBLICATIONS

Final Office Action, United States Patent & Trademark Office, U.S. Appl. No. 10/442,352 filed on May 21, 2003, Sep. 4, 2007.

(Continued)

*Primary Examiner*—Son Dinh
(74) *Attorney, Agent, or Firm*—Vierra Magen Marcus & DeNiro LLP

(57) ABSTRACT

A memory device, system and method for allowing an early read operation after one or more write operations is provided according to an embodiment of the present invention. The memory device comprises an interface for providing a first write address, a first write data, and a read address. A memory core is coupled to the interface and includes a first memory section having a first data path and a first address path and a second memory section having a second data path and a second address path. In an embodiment of the present invention, the first data and first address path is independent of the second data and second address path. The first write data is provided on the first data path responsive to the first write address being provided on the first address path while a read data is provided on the second data path responsive to the read address being provided on the second address path.

22 Claims, 14 Drawing Sheets

U.S. PATENT DOCUMENTS

| | | | |
|---|---|---|---|
| 5,367,494 A | 11/1994 | Shebanow | |
| 5,631,343 A | 5/1997 | Binns et al. | |
| 5,748,539 A | 5/1998 | Sproull et al. | |
| 5,778,419 A | 7/1998 | Hansen et al. | |
| 5,893,927 A | 4/1999 | Hovis | |
| 5,893,929 A | 4/1999 | Shadan et al. | |
| 6,018,478 A | 1/2000 | Higuchi | |
| 6,044,429 A | 3/2000 | Ryan et al. | |
| 6,091,660 A | 7/2000 | Sasaki et al. | |
| 6,128,728 A | 10/2000 | Dowling | |
| 6,178,132 B1 | 1/2001 | Chen et al. | |
| 6,243,799 B1 | 6/2001 | Chan | |
| 6,314,046 B1 * | 11/2001 | Kamiya et al. | 365/230.04 |
| 6,343,352 B1 | 1/2002 | Davis et al. | |
| 6,401,167 B1 | 6/2002 | Barth et al. | |
| 6,636,935 B1 | 10/2003 | Ware | |
| 6,640,292 B1 | 10/2003 | Barth et al. | |
| 6,789,175 B2 | 9/2004 | Ryan et al. | |
| 6,807,590 B1 | 10/2004 | Carlson et al. | |
| 7,058,863 B2 | 6/2006 | Kouchi et al. | |
| 2002/0018394 A1 * | 2/2002 | Takahashi | 365/233 |
| 2002/0087750 A1 | 7/2002 | Yi | |

FOREIGN PATENT DOCUMENTS

| | | |
|---|---|---|
| EP | 0833342 | 4/1998 |
| EP | 0833343 A2 | 4/1998 |

OTHER PUBLICATIONS

Response to Final Office Action, U.S. Appl. No. 10/442,352 filed on May 21, 2003, Oct. 24, 2007.

* cited by examiner

EARLY READ AFTER WRITE OPERATION MEMORY DEVICE, SYSTEM AND METHOD

PRIORITY DATA

This application is a continuation of U.S. patent application Ser. No. 10/353,405 filed Jan. 29, 2003, now U.S. Pat. No. 7,187,572, entitled "An Early Read After Write Operation Memory Device, System and Method", by inventors Richard E. Perego and Frederick A. Ware, currently allowed, which application claims priority to U.S. Provisional Patent Applications No. 60/392,197 and 60/392,198, both filed Jun. 28, 2002, entitled "An Early Read After Write Operation Memory Device, System And Method" and "Memory Device and System Having A Variable Depth Write Buffer And Preload Method", by inventors Richard E. Perego and Frederick A. Ware,

FIELD OF THE INVENTION

The present invention relates to the transfer of data in a digital system, and in particular, a memory device and method for read and write operations.

BACKGROUND OF THE RELATED ART

Typically, an amount of idle time, known as a "bubble", occurs on the data interface of a memory device when switching from a write transfer to a read transfer, also known as "W-R turnaround bubble" time. This idle time generally occurs from resource conflicts within the memory device and/or device operating constraints.

Memory device resource conflicts may consist of: 1) shared I/O pins or circuitry between read and write operations, for example bidirectional pins, 2) shared data paths between read and write operations, for example input/output paths, shifters, column I/O amplifiers and bit lines, and 3) shared address/control paths between read and write operations, for example a column decoder or predecoder logic. Many memory devices share resources in order to reduce incremental manufacturing costs and complexity.

Device operating constraints may include peak current or power restrictions related to customer usage requirements or memory device reliability requirements.

Memory devices have reduced W-R turnaround bubble time by providing a write buffer for buffering write data and address information. However, a single write buffer may cause a delay in a write operation allowing a read operation to occur before the desired write operation. Thus, a user may receive erroneous data that does not include the latest write data. Complex circuitry may be required in order to ensure data coherency when using a single write buffer. Also, a single write buffer may not be programmed to improve data transfer efficiency in multiple memory device configurations.

What is therefore desirable is a memory device and/or method that provides improved interconnect utilization within operating constraints at a low incremental device cost and complexity. In particular, it is desirable that the memory device reduces W-R turnaround bubble time without additional complex circuitry. The memory device should also be easily adaptable to multiple memory device system configurations. Further, it is desirable for a read and write operation method that allows for a 1) reduced write address buffer, 2) higher memory array utilization and, 3) reduced or simplified scheduling or data coherency logic.

SUMMARY

A memory device, system and method for allowing an early read operation after one or more write operations is provided according to an embodiment of the present invention. A memory device comprises an interface, a first storage array and a second storage array. A first interconnect structure is coupled to the interface and the first data storage array. The first interconnect structure transfers a first data between the interface and the first storage array. A second interconnect structure is coupled to the interface and the second storage array. The second interconnect structure transfers a second data between the interface and the second storage array. The first data is transferred on the first interconnect structure, during a first period of time, responsive to a first command received at the interface. The second data is transferred on the second interconnect structure, during the first period of time, responsive to a second command received at the interface.

According to another embodiment of the present invention, the interface includes a command interface to receive commands and a data interface to receive data.

According to another embodiment of the present invention, the first command is a READ command and the second command is a WRITE command.

According to another embodiment of the present invention, the interface is capable of connecting to a first external interconnect structure which transfers commands to the interface.

According to another embodiment of the present invention, the interface is capable of connecting to a second external interconnect structure which transfers data to the interface.

According to another embodiment of the present invention, the interface selectively couples the first external interconnect structure to the first internal interconnect structure and the second internal interconnect structure. The interface also selectively couples the second external interconnect structure to the first internal interconnect structure and the second internal interconnect structure.

According to another embodiment of the present invention, a memory system comprises a memory device, a bus coupled to the memory device and a controller coupled to the bus to generate the first command and the second command. The memory device comprises an interface, a first storage array and a second storage array. A first interconnect structure is coupled to the interface and the first data storage array. The first interconnect structure transfers a first data between the interface and the first storage array. A second interconnect structure is coupled to the interface and the second storage array. The second interconnect structure transfers a second data between the interface and the second storage array. The first data is transferred on the first interconnect structure, during a first period of time, responsive to a first command received at the interface. The second data is transferred on the second interconnect structure, during the first period of time, responsive to a second command received at the interface.

According to another embodiment of the present invention, the memory system is included in a monolithic integrated circuit.

According to another embodiment of the present invention, a memory controller comprising an interface and a logic block is provided. The logic block generates a first command and a second command to a memory device, having a first interconnect structure and a second interconnect structure, in order to maximize data transfer at the interface.

According to still another embodiment of the present invention, a memory device comprises an interface for providing a first write address, a first write data, and a read address. A memory core is coupled to the interface and includes a first memory section having a first data path and a first address path and a second memory section having a second data path and a second address path. In an embodiment of the present invention, the first data and first address path is independent of the second data and second address path. The first write data is provided on the first data path responsive to the first write address being provided on the first address path while a read data is provided on the second data path responsive to the read address being provided on the second address path.

According to an embodiment of the present invention, an external interconnect structure, coupled to the interface, provides a first WRITE command associated with the first write data and a READ command associated with the read address. The first WRITE command precedes the READ command.

According to an embodiment of the present invention, the external interconnect structure provides a second WRITE command associated with a second write data. The first WRITE command and second WRITE command precede the READ command.

According to an embodiment of the present invention, the first data path is independent of the second data path.

According to an embodiment of the present invention, the first address path is independent of the second address path.

According to still another embodiment of present invention, the first data path includes a first set of global data wires and the second data path includes a second set of global data wires.

According to an embodiment of the present invention, the first data path includes a first I/O amp and the second data path includes a second I/O amp.

According to an embodiment of the present invention, the first address path includes a first column precoder and the second address path includes a second column precoder.

According to an embodiment of the present invention, the first address path includes a first column decoder and the second address path includes a second column decoder.

According to an embodiment of the present invention, the memory core includes a dynamic random access memory ("DRAM") core.

According to an embodiment of the present invention, a memory system comprises a master device coupled to a communication channel. The master device is configured to generate a memory WRITE command with associated write information and a write address followed by a memory READ command with an associated read address. A slave memory device is coupled to the communication channel and includes a first memory array having a first data path and a first address path. The slave memory device also includes a second memory array having a second data path and the second address path. The associated write information is provided on the first data path responsive to the write address being provided on the first address path while a read data is provided on the second data path responsive to the read address being provided on the second address path.

According to still another embodiment of the present invention, a method of operating a memory system with a master device coupled to a slave memory device having a memory core is provided. The master device generates a write address and write information. The master device generates a read address. The first write information is provided to a first section of the memory core responsive to the write address during a read of a second section of the memory core responsive to the read address.

These and other embodiments of the present invention, as well as other aspects and advantages, are described in more detail in conjunction with the figures, the detailed description, and the claims that follow.

DETAILED DESCRIPTION

Figure 1:
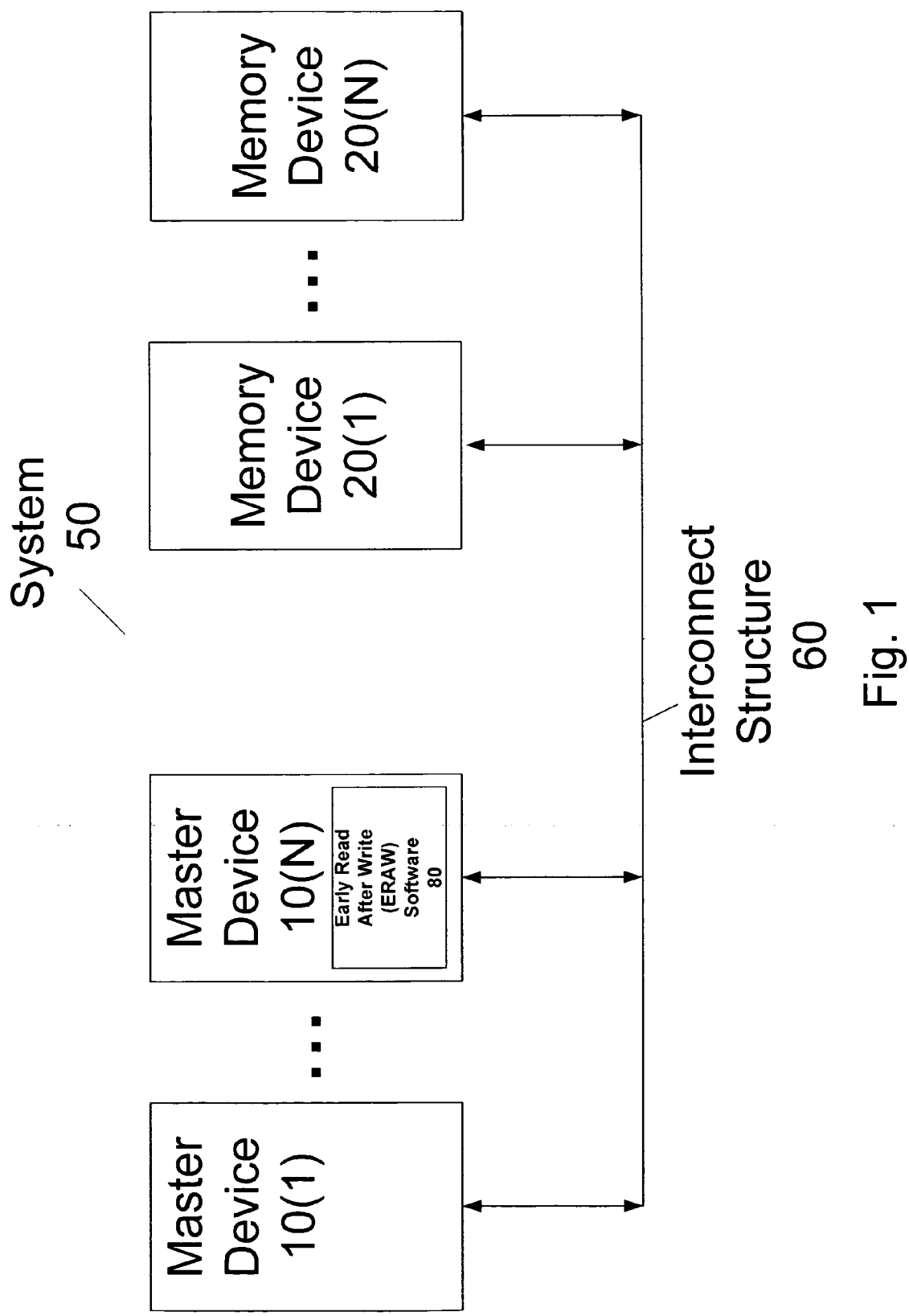
FIG. 1 is a block diagram of a digital system according to an embodiment of the present invention.
Figure 5:
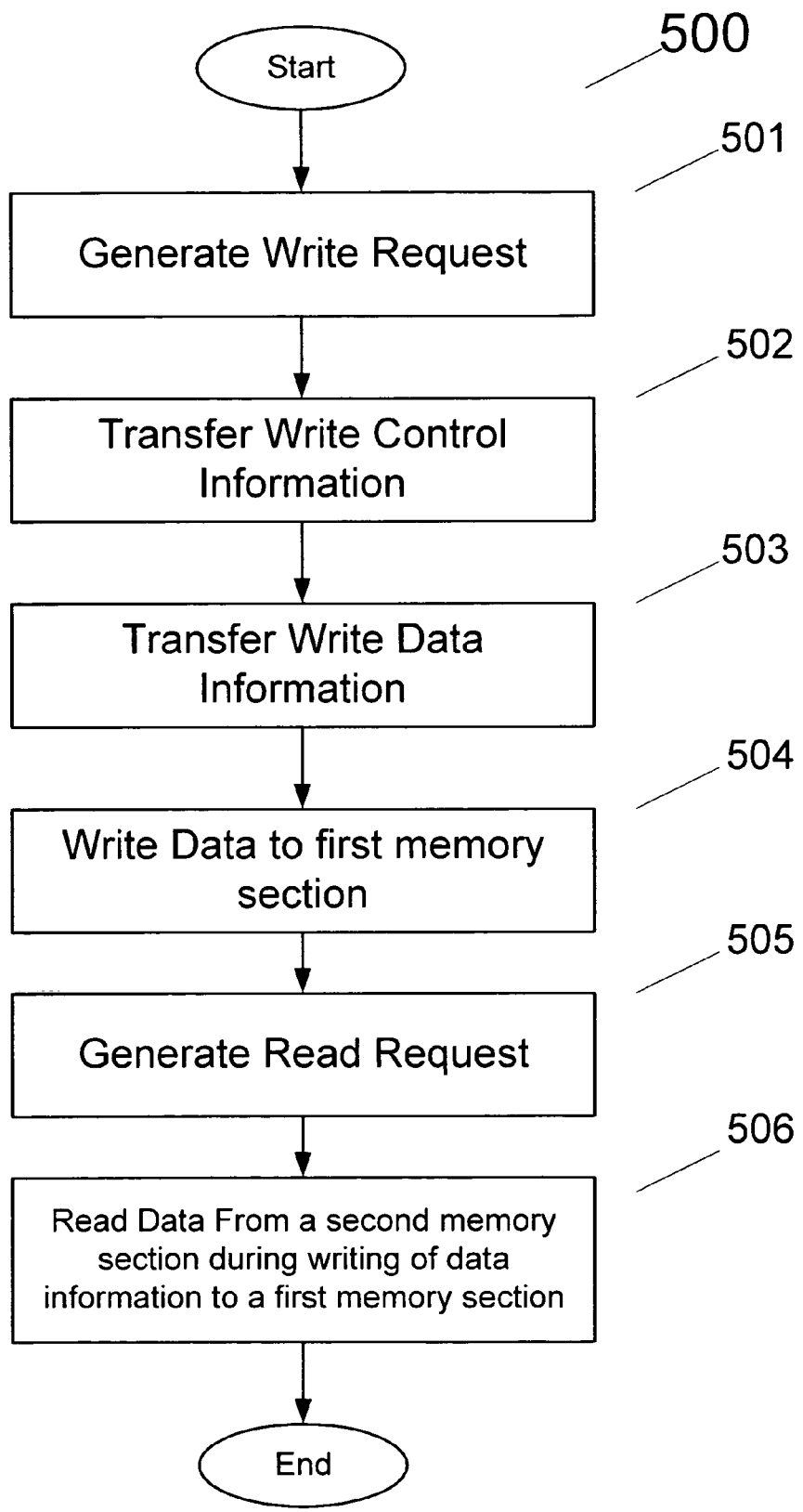
FIG. 5 is a flow chart of an early read after write method according to an embodiment of the present invention.

The present invention provides an early read after write ("ERAW") method 500 shown in FIG. 5, which may be implemented in a memory system 50, that supports improved utilization of an interconnect structure 60 between master devices 10(1)-(N) and memory devices 20(1)-(N) shown in FIG. 1.

A memory device, according to an embodiment of the present invention, maintains continuous data traffic by supporting a read operation which can begin early, while one or more previous write operations are still being processed in an embodiment of the present invention. A read operation targets a section of memory core that has an independent data path (for example, global data wires and column I/O amps) and an independent address path (for example, separate column predecoders and column decoders) from those used by the outstanding write operations.

In an embodiment of the present invention, a write operation on a memory device 20(1) is initiated by asserting a WRITE ("WR") command on interconnect structure 60 from master device 10(1) and includes a transport sub-operation and a retire sub-operation. These sub-operations may be individually specified using two other commands ("PLD" and "ULD"); in other words, the WR command causes both sub-operations to occur, and the PLD and ULD commands cause only one of the sub-operations to take place.

A transport sub-operation on memory device 20(1) can be initiated by asserting a PRELOAD ("PLD") command on interconnect structure 60 from master device 10(1) and includes receiving write data from interconnect structure 60 and storing write data in a buffer in an embodiment of the present invention.

A retire sub-operation on memory device 20(1) can be initiated by asserting a UNLOAD ("ULD") command on interconnect structure 60 from master device 10(1) and includes transferring write data from a buffer to a memory core in an embodiment of the present invention.

A read operation on memory device 20(1) is initiated by asserting a READ command on interconnect structure 60 from master device 10(1) and includes obtaining data from a memory core at a column address and transmitting read data on interconnect structure 60 in an embodiment of the present invention.

An activate operation on memory device 20(1) is initiated by asserting an ACTIVATE ("ACT") command on interconnect structure 60 from master device 10(1) and includes sensing a row at a row address and transferring data in a memory bank to a sense amplifier in an embodiment of the present invention.

A precharge operation on memory device 20(1) is initiated by asserting a PRECHARGE ("PRE") command on interconnect structure 60 from master device 10(1) and includes precharging a memory bank in an embodiment of the present invention.

In an embodiment of the present invention, master device 10(1) is a central processing unit in a desktop computer and memory device 20(1) is main memory, such as Dynamic Random Access Memory ("DRAM") in the desktop computer. In an alternate embodiment of the present invention, master device 10(1) is a memory controller. In alternate embodiments of the present invention, master devices 10(1)-(N), interconnect structure 60 and memory devices 20(1)-(N) are in a processing device such as a mainframe computer, a laptop computer, a hand-held computer, a personal digital assistant, a telephone, a cellular telephone, a pager, a printer, an information appliance, or an equivalent thereof. In an embodiment of the present invention, master device 10(1)-(N), interconnect structure 60 and memory devices 20(1)-(N) are incorporated on an integrated monolithic circuit.

In an embodiment of the present invention, master devices 10(1)-(N) and memory devices 20(1)-(N) are coupled by an interconnect structure 60 which allows for one or more master devices 10(1)-(N) and one or more slave devices, such as memory devices 20(1)-(N). The term "N" is used as a general variable; its use should not imply the number of master devices is identical to the number of slave devices. In an embodiment of the present invention, other components and/or subsystems may be coupled to interconnect structure 60 that are not shown. In an embodiment of the present invention, interconnect structure 60 is an external interconnect structure from memory devices 20(1)-(N). In an embodiment of the present invention, interconnect structure 60 is a bidirectional memory bus having control and data signal lines. In an alternate embodiment of the present invention, interconnect structure 60 includes only data lines or only control lines. In still another embodiment of the present invention, interconnect structure 60 is a unidirectional bus. In an embodiment of the present invention, the block diagram of FIG. 1 is applicable to intrachip, as well as interchip, communications.

Figure 2:
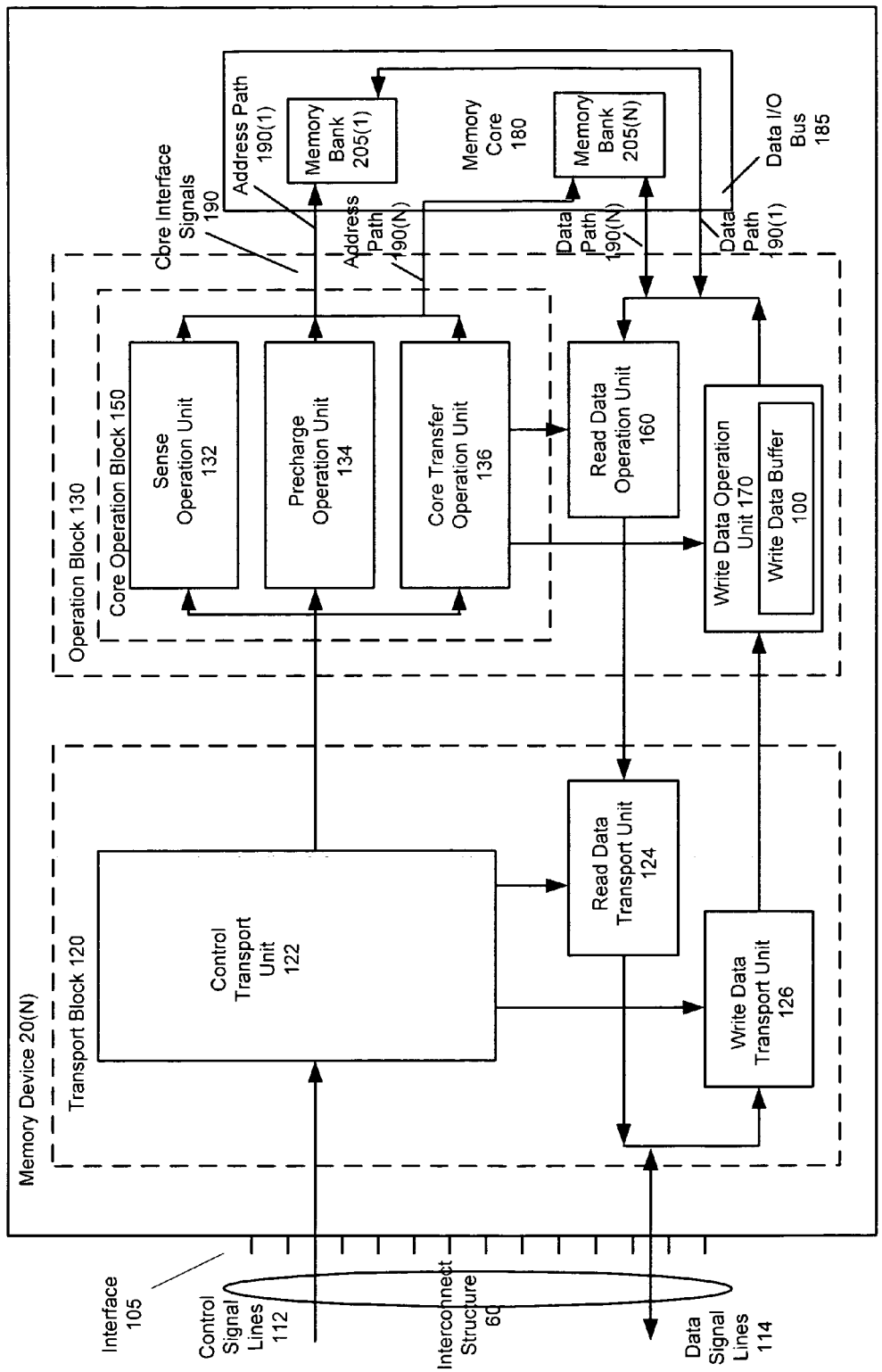
FIG. 2 is a block diagram of a memory device allowing for an early read operation after a write operation according to an embodiment of the present invention.

FIG. 2 illustrates a memory device 20(N) as shown in FIG. 1 according to an embodiment of the present invention. Memory device 20(N) is capable of being read from, and written to by, a master device 10(1). An interconnect structure 60 is used to communicate control information over control lines 112 and data information over data lines 114 from the memory controller to memory device 20(N). In an embodiment of the present invention, memory device 20(N) includes an interface 105 for coupling to interconnect structure 60. In an embodiment of the present invention, interface 105 includes I/O pins. To support such communications and the storage of data, memory device 20(N) typically includes three major functional blocks.

The first of these, a transport block 120, is coupled to interconnect structure 60. Interconnect structure 60, which includes control signal lines 112 and data signal lines 114, is used to read from and write to memory device 20(N). Interconnect structure 60 provides the proper control signals and data when data is to be written to memory device 20(N). Transport block 120 receives these signals and takes the actions necessary to transfer this information to the remaining portions of memory device 20(N). When memory device 20(N) is read, transport block 120 transmits data on data signal lines 114 in response to control information on control signal lines 112. Transport block 120 includes a control transport unit 122 which receives control information on control signal lines 112, and controls a read data transport unit 124 and a write data transport unit 126 to support the communication protocol used in transferring information over interconnect structure 60 (e.g., transferring information between master device 10(1), such as a processor, and memory device 20(N) over interconnect structure 60, such as a memory bus). In an embodiment of the present invention, transport block 120 is merely wiring, without any active components whatsoever. In this embodiment, control transport unit 122 would simply be wires, as read data transport unit 124 and write data transport unit 126 would require no control. In effect, transport block 120 is not implemented in such an embodiment. Another embodiment of the present invention includes configuring amplifiers to provide the functionality of transport block 120. In yet another embodiment of the present invention, transport block 120 includes serial-to-parallel converters. In this case, control transport unit 122 controls the conversion performed by read data transport unit 124 and write data transport unit 126 (which would be the serial-to-parallel converters). Other equivalent circuits may also be used with equal success.

The second of the major functional blocks is an operations block 130. Operations block 130 receives control information from transport block 120, more specifically from control transport unit 122, which provides the requisite signals to a control operation unit 150.

Core transfer operation unit 136 controls read data operation unit 160 and write data operation unit 170 when transferring data from and to memory core 180, respectively (i.e., read and write operations). Core transfer operation unit 136 also controls memory core 180, causing memory core 180 to store write data and output read data. Precharge operation unit 134 controls memory core precharge operations, which precharge the selected banks in memory core 180. Sense operation unit 132 is provided for the control of memory core sense operations.

The subsystems of operations block 130 use the control information received to coordinate movement of control and data information to and from memory core 180. Read data operation unit 160 and write data operation unit 170 contain circuitry specific to the functions that read and write data from and to memory core 180, respectively. Core transfer operation unit 136 contains circuitry used to control memory core 180, including circuitry for the control of read and write operations. Core interface signals 190 are provided to control memory core 180.

In FIG. 2, control operation unit 150 controls a typical array of DRAM memory cells. In an alternate embodiment of the present invention, control operation unit 150 generates core interface signals for a particular DRAM memory cell architecture. Control operation unit 150 includes a sense operation unit 132, a precharge operation unit 134, and a core transfer operation unit 136 in an embodiment of the present invention.

Data being read is transferred from the third functional block, a memory core 180, via data I/O bus 185 to a read data operation unit 160. From read data operation unit 160, the data being read is transferred to read data transport unit 124 (and subsequently, onto data signal lines 114) in response to control signals from control operation unit 150. Read data operation unit 160 may consist of, for example, data buffers (not shown) that buffer the outgoing data signals to drive read data transport unit 124.

Data is transferred from write data transport unit 126 to a write operation unit 170 in response to control signals from control transport unit 122 (if used) and control operation unit 150. Write data operation unit 170 receives write data from write transport unit 126, which is passed on to memory core 180 via data I/O bus 185. As shown, write data core transfer operation unit 136 may control write operation unit 170. In an embodiment of the present invention, write data operation unit 170 includes a write data buffer 100 that buffers the incoming data signals.

In an embodiment of the present invention, write data buffer 100 is a variable depth write data buffer as described in the above identified related patent application entitled "Memory Device and System Having A Variable Depth Write Buffer And Preload Method" filed Jun. 28, 2002, by inventors Richard E. Perego and Frederick A. Ware, which is incorporated by reference herein.

Write data operation unit 170 may also contain mask buffers that buffer mask information received from write data transport unit 126. As with data buffering, these actions may be taken under the control of core transfer operation unit 136. The mask information is then passed to memory core 180 via data I/O bus 185, as well. The mask information is used to selectively write parts of the data within the memory core. In an alternate embodiment of the present invention, no mask is employed, with the result that all the data is written unconditionally.

In an alternate embodiment of the present invention, memory device 20(N) includes a shifter and/or predecoder circuitry.

The circuitry of control operation block 150 may take any number of appropriate configurations, depending in part on the architecture of memory core 180. In embodiments of the present invention, the memory cells of memory core 180 may be static random access memory ("SRAM") cells, read-only memory ("ROM") cells, DRAM cells, or other types of memory cells. The type of memory cells employed in memory core 180 affects the architecture of control operation unit 150, as different memory cells often require different control signals for their operation. Operational block 130 thus contains core transfer operation 150, read data operation unit 160, and write data operation unit 170.

In an embodiment of the present invention, memory core 180 includes N memory banks having independent address and data paths. For example, memory bank 205(1) has address path 190(1) and data path 190(1). Similarly, memory bank 295(N) has address path 190(N) and data path 190(N).

In a memory core 180 having a DRAM-type memory cells embodiment, operations which may be performed on memory core 180 (referred to herein as core operations) may be generalized into four primary categories: 1) precharge; 2) sense; 3) read; and 4) write.

Figure 3:
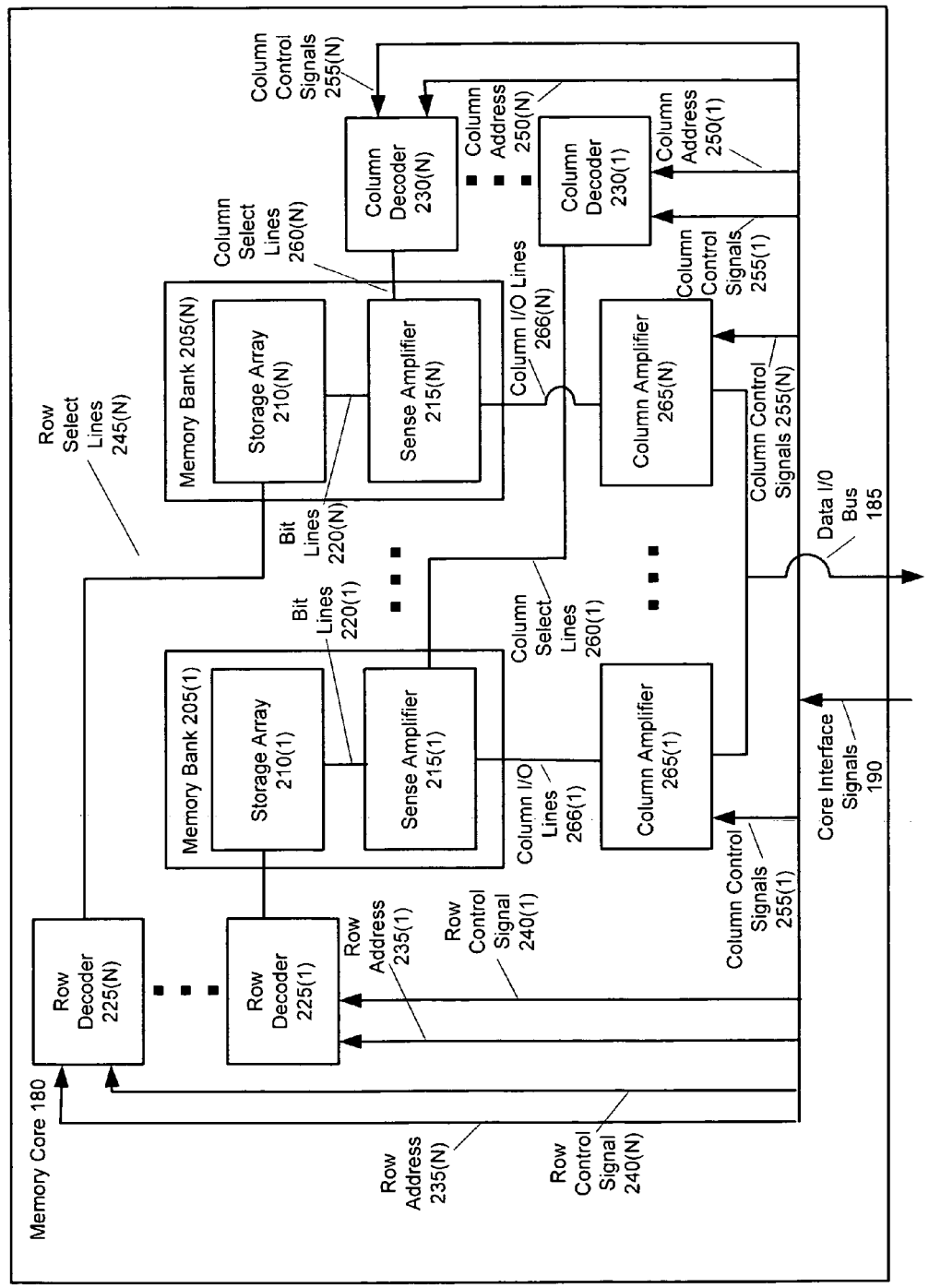
FIG. 3 is a block diagram of a memory core having an independent data path and an address path according to an embodiment of the present invention.

FIG. 3 illustrates a memory core 180 shown in FIG. 2 in an embodiment of the present invention. Memory core 180 includes several basic functional blocks. Memory core 180 is illustrated as including multiple memory banks 205(1)-(N). Included in each of memory banks 205(1)-(N) are a storage array, exemplified by storage arrays 210(1)-(N), and a set of sense amplifiers, exemplified by sense amplifiers 215(1)-(N). Storage arrays 210(1)-(N) are central to the function of memory core 180, actually holding the data to be stored. Storage arrays 210(1)-(N) are connected to sense amplifiers 215(1)-(N) by bit lines 220(1)-(N), respectively. Storage arrays 210(1)-(N) are organized into rows and columns of storage cells, each of which stores one bit of information in an embodiment of the present invention. In an alternate embodiment, a storage cell in storage arrays 210(1)-(N) stores multiple bits of information.

Also included in memory core 180 are row decoders 225(1)-(N) and column decoders 230(1)-(N). Row addresses 235(1)-(N) is provided to row decoders 225(1)-(N), along with row control signals 240(1)-(N), which cause row decoders 225(1)-(N) to latch a row address. In turn, row decoders 225(1)-(N) presents this address information to memory banks 205(1)-(N) via row select lines 245(1)-(N). Similarly, column addresses 250(1)-(N) is provided to column decoders 230(1)-(N), along with column control signals 255(1)-(N), which causes column decoders 230(1)-(N) to latch a column addresses. In turn, column decoder 230(1)-(N) presents this address information to memory banks 205(1)-(N) via column select lines 260(1)-(N) to select which sense amplifiers are connected to the column amplifiers 265(1)-(N). The column control signals 255(1)-(N) may include a mask bit signal to selectively mask individual sense amplifiers in accordance with a predetermined masking scheme.

Column control signals 255(1)-(N) are also provided to column amplifiers 265(1)-(N). Column amplifiers 265(1)-(N) are coupled to sense amplifiers 215(1)-(N) by column I/O lines 266(1)-(N), and amplify the data signals input to and output from sense amplifiers 215(1)-(N). Column amplifiers 265(1)-(N) are also coupled to data I/O bus 185, permitting the communication of control signals from operations block 130 to the various control structures within memory core 180. The signals aggregated as core interface signals 190, as illustrated in FIG. 2, thus include row addresses 235(1)-(N), row control signals 240(1)-(N), column addresses 250(1)-(N), and column control signals 255(1)-(N). Thus, the interface to a memory core 180 generally consists of a row address, a column address, a data path, and various control signals, including mask signals.

As shown in FIG. 3, memory cores can have multiple banks, which allow simultaneous row operations within a given core in an embodiment of the present invention. The use of multiple banks improves memory performance through increased concurrency and a reduction of conflicts. Each bank has its own storage array and can have its own set of sense amplifiers to allow for independent row operation. In an embodiment of the present invention, each bank has a respective row decoder, a column decoder, column amplifier, data path and address path.

Accessing the information in a storage array (i.e., reading data stored in storage arrays 210(1)-(N)) is typically a two-step process. First, data is transferred between storage array 210(1)-(N) and a corresponding set of sense amplifiers 215(1)-(N). Next, the data is transferred between the sense amplifiers involved and column amplifiers 265(1)-(N). Certain memory core architectures do away with the column amplifiers, transferring the data from the sense amplifiers directly to the data I/O bus 185.

The first major step, transferring information between storage arrays 210(1)-(N) and sense amplifiers 215(1)-(N), is known as a "row access" and is broken down into the minor operations of precharge and sense. The precharge operation prepares the sense amplifiers and bit lines for sensing, typically by equilibrating them to a midpoint reference voltage. During the sense operation, the row address is decoded, a single word line is asserted, the contents of the storage cell is placed on the bit lines, and the sense amplifiers amplify the value to full rail (i.e., a full digital high value), completing the movement of the information from the storage array to the sense amplifiers. Of note is the fact that the sense amplifiers can also serve as a local cache that stores a "page" of data that can be more quickly accessed with column read or write accesses. The second major step, transferring information between the sense amplifiers and the interface, is called a "column access" and is typically performed in one step. However, variations are possible in which this major step is broken up into two minor steps, e.g. putting a pipeline stage at the output of the column decoder. In this case, the pipeline timing should be adjusted to account for the extra time involved.

These two steps give rise to the four basic memory operations mentioned previously: 1) precharge; 2) sense; 3) read; and 4) write. In an embodiment of the present invention, memory core 180 supports these four operations (or some subset thereof). In an alternate embodiment, certain memory types may require additional operations to support architecture-specific features.

A significant limitation on the effective bandwidth of interconnect structure 60 can arise as the result of the issuance of certain combinations of read and write operations. For example, the issuances of certain READ/WRITE command combinations may intrinsically introduce inefficiencies in the utilization of interconnect structure 60. For example, a delay, also known as a W-R turnaround time data bubble, may occur when a write operation is followed by a read operation. Because the write data is immediately present on interconnect structure 60 and the read data is not present until a later time (determined by the access time of the device being read), a data bubble between the write data and read data naturally occurs. This data bubble impairs the efficient utilization of interconnect structure 60 and the column I/O data path. These delays are of particular importance in systems which are configured to maintain full or almost full utilization of interconnect structure 60 by constantly (or nearly constantly) transferring data to and from components attached thereto.

In a memory device 20(1), the resource usage ordering for read and write operations differs slightly. A read operation uses resources in the order: 1) control signal lines 112, 2) column I/O data path (including data I/O bus 185 and column I/O lines 266), and 3) data signal lines 114; while, a write operation uses them in the order: 1) control signal lines 112, 2) data signal lines 114, and 3) column I/O data path (including data I/O bus 185 and column I/O lines 266).

These differences in the ordering of resource usage give rise to resource conflicts when read and write operations are issued to a specific memory bank because control signals issued over control signal lines 114 cause data to be transferred immediately, in relative terms. Thus, if data signal lines 114 and the column I/O data path are bidirectional (as is desirable), conflicts can occur between read data and write data to a specific memory bank because each transfer requires the use of these resources.

Figure 4:
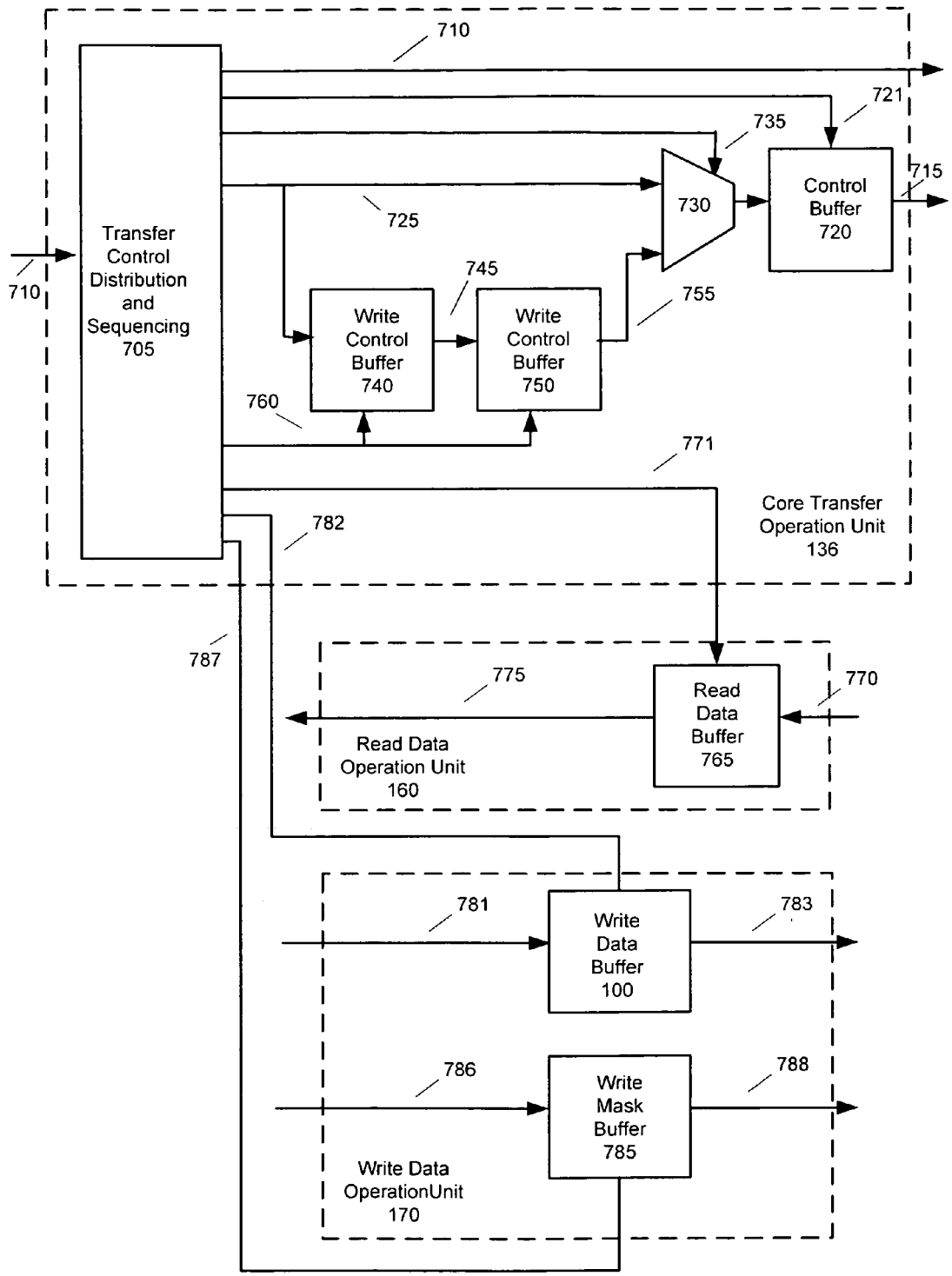
FIG. 4 is a detailed block diagram of circuitry shown in FIG. 3 according to an embodiment of the present invention.

FIG. 4 shows the structure of a core transfer operation unit 136, a read data operation unit 160, and a write data operation unit 170 for a memory that performs operations that are signaled on the control lines according to an embodiment of the present invention. Control signals 710 are received from control transport unit 122. Transfer, control, distribution, and sequence ("TCDS") block 705 produces signals to control the memory core 180, the read data operation unit 160, and write data operation unit 170. TCDS block 705 handles transfer, control, signal distribution, and sequencing responsibilities. Signals 710 are the edge based control signals for memory core 180. Signals 715 are signals that are presented to core 180 for a duration of time, and usually have setup and hold requirements with respect to the transition times of signals 710, and are produced by control buffer 720. For a read operation, control buffer 720 receives control signals directly from TCDS block 705 via signals 725 through multiplexer 730 that is controlled by signal 735. For a write operation, control buffer 720 receives control signals from TCDS block 705 via write control buffer 740, signals 745, write control buffer 750, signals 755, and multiplexer 730 (under the control of signal 735). Write control buffers 740 and 750 are controlled by signals 760. For write control buffer write operations, signals 710 are timed to correspond to the arrival of the operation to signals 715. Write control buffers 740 and 750 delay the application of the operation control to the memory core. This delay allows the data corresponding to the buffered write operation to be issued later, better matching the timing of the write operation to that of the read operation when accessing a targeted memory bank. Other embodiments may use additional blocks to change the amount of the delay. For example, a First-in-First-Out ("FIFO") or queue buffer is a preferred storage mechanism for the write data buffer and the write control buffer. In an alternate embodiment of the present invention, less control storage is needed when the control information is supplied by a retire sub-operation instead of the transport sub-operation.

Read data buffer 765 receives read data on signals 770 from memory core 180, at times controlled by signal 771. This data is passed on to the transport block 120 via signals 775. In another embodiment, read data buffer 765 is an amplifier driving signals 775 without timing signal 771. In yet another embodiment, read data operation unit 160 is comprised only of a wire. Other variations for read data operation unit 160 are possible, depending on specific drive and timing characteristics of memory core 180.

Write data buffer 100 receives write data from transport block 120 via signals 781 at times controlled by signal 782. In an alternate embodiment of the present invention, write data buffer 100 is a variable depth write data buffer. Write data is passed on to the memory core 180 via signals 783. Write mask buffer 785 receives mask data from the transport unit on signals 786 at times controlled by signal 787. The mask information is passed on to memory core 180 via signals 788. Mask data is used by memory core 180 to selectively write, or not write, parts of the data within memory core 180. In another embodiment, no mask is used, with the result that all the data is written unconditionally.

In an embodiment of the present invention, ERAW method 500, illustrated in FIG. 5, is performed, in part, by ERAW software 80 stored in master device 10(N). In an alternate embodiment, components of ERAW software 80 are stored in other devices illustrated in FIG. 1. In an embodiment of the present invention, ERAW software 80 is stored in an article of manufacture, such as a computer readable medium. For example, RAW software 80 is stored in a magnetic hard disk, an optical disk, CD-ROM ("Compact Disk Read-Only Memory"), RAM ("Random Access Memory"), ROM ("Read-Only memory") or other readable or writeable data storage technologies, singly or in combination.

In an embodiment of the present invention, a logic box or step illustrated in FIG. 5 represent an execution of a software component, such as a software program, a software object, a software function, a software subroutine, a software method, a software instance, a code fragment, singly or in combination. In an alternate embodiment of the present invention, a logic box or step represents execution of a software operation, hardware operation, singly or in combination. In alternate embodiments of the present invention, fewer or more logic boxes or steps are carried out in method 500.

Method 500 initiates by a master device 10(N) generating a write request to a memory device, such as memory device 20(1) illustrated in FIG. 1, as represented by logic block 501.

Write control information, such as address information, is then transferred by master device 10(N) on interconnect structure 60 to a targeted memory device as represented by logic block 502.

Similarly, write data is then transferred by master device 10(N) on interconnect structure 60 to the targeted memory device as represented by logic block 503.

The data is then written to a first memory bank, such as memory bank 205(1) illustrated in FIG. 3, in the targeted memory device as represented by logic block 504. In an alternate embodiment of the present invention, blocks 501-503 are repeated to perform multiple write operations to the targeted memory bank.

A read request for a second memory bank of the targeted memory device, such as memory bank 205(N) illustrated in FIG. 3, is generated by master device 10(N) as represented by logic block 505.

Data is read from the second memory bank, such as memory bank 205(N), of the targeted memory device while data is written to the first memory bank of the targeted memory device as represented by logic block 506.

Method 500 then ends.

Figure 6:
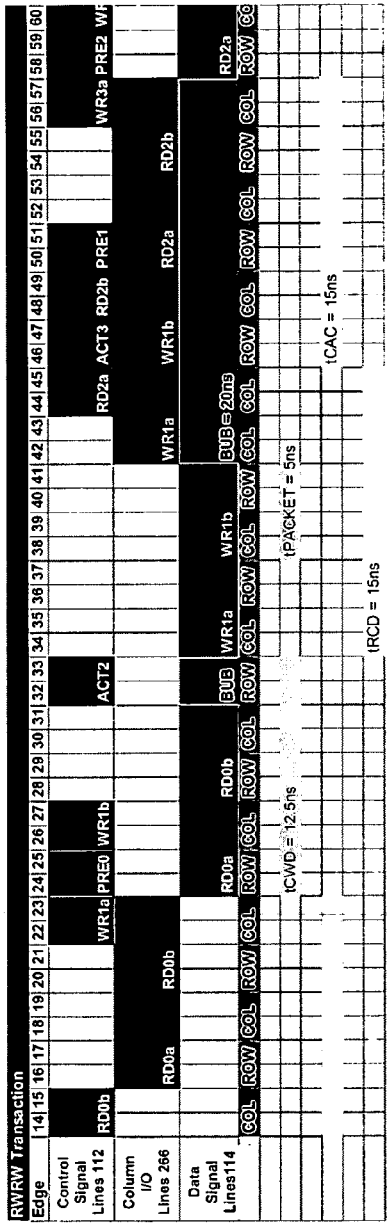
FIG. 6 is a timing diagram of a write operation and a read operation.

FIG. 6 is a timing diagram illustrating a W-R turnaround bubble time BUB using a memory device that does not have a write data buffer or early RAW software. In an embodiment of the present invention, every 4 horizontal cells in FIGS. 6-7 equals 5 ns.

In an embodiment of the present invention, control signals received by memory device 20(N), and in particular on control signal lines 112 illustrated in FIG. 2, are represented on the row labeled control signal lines 112. A shaded box represents the duration of a particular signal on control signal lines 112. For example, a shaded box labeled RD0b at row control signal lines 112 and columns 14-15 represents a READ command signal generated on control signal lines 112 for reading the contents of memory core 180. Shaded boxes are grayscale coded to correspond to associate memory bank 205 addresses.

In an embodiment of the present invention, a READ command is represented as RD0a, RD0b, . . . RD2a, RD2b . . . ; while, a WRITE command is represented as WR1a, WR1b, WR1c . . . . Similarly, column I/O signals generated by memory device 20(N) on column I/O lines 266(1) are represented on the row labeled column I/O lines 266(1); while, column I/O signals generated by memory device 20(N) on column I/O lines 266(N) are represented on the row labeled column I/O lines 266(N). In an embodiment of the present invention, bi-directional data signals generated on data lines 114 are represented on the row labeled data signal lines 114. In an embodiment of the present invention, a PRECHARGE command is represented as PRE0, PRE01, PRE2, and an ACTIVATION command is represented as ACT2. A first ACTIVATION command, ACT1, is not shown in FIG. 6 because the command occurred before edge 14.

In an embodiment of the present invention, a PRECHARGE command prepares sense amplifier 215(1) and bit lines 220(1) for sensing, typically by equilibrating them to a midpoint reference voltage. During the sense operation, row address 235(1) is decoded, a single word line is asserted, the contents of the storage cell is placed on bit lines 220(1), and sense amplifier 215(1) amplifies the value to full rail (i.e. a full digital high value), completing the movement of the information from storage array 210(1) to sense amplifier 215(1). Transferring information on column I/O lines 266(1) from sense amplifier 215(1) to column amplifier 265(1) is known as "column access." A read column access transfers information from a sense amplifier to a column amplifier to data lines and out to the data interface. A write column access (without a write buffer) is the reverse.

In an embodiment of the present invention, an ACTIVATE command allows for accessing a particular memory bank 205(1).

tRP time is defined as the time between the end of a PRECHARGE command on control signal lines 112 and the end of an ACT command (to the same bank) on control signal lines 112 in an embodiment of the present invention.

tCWD time is defined as the time between the end of a WRITE command on control signal lines 112 and the beginning of receiving write data on data signal lines 114 in an embodiment of the present invention.

tRCD time is defined as the time interval between the end of ACTIVATE command and the end of a READ or WRITE command on control signal lines 112 in an embodiment of the present invention.

tCAC time is defined as the time interval between the end of a READ command and the beginning of generating read data on data lines 114 in an embodiment of the present invention.

In an embodiment of the present invention, a write operation for a memory device 20(N) is defined as the time between the last bit obtained (for writing) from a data pin interface (for example, data signal lines 114) to the beginning of a column I/O cycle (for example, column I/O lines 266(1)). In an embodiment of the present invention, a write operation occurs in 5 ns using an 800 MHz clock signal. In an embodiment of the present invention, a read operation for memory device 20(N) is defined as the time from when a memory cell in memory core 180 is latched to the first bit obtained (for reading) from a data pin (for example, data signal lines 114).

Figure 7:
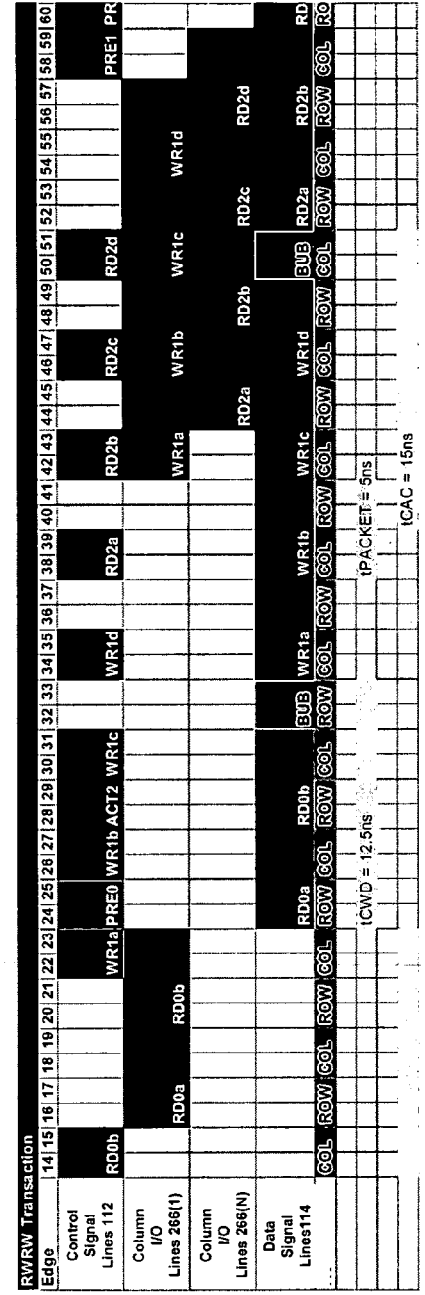
FIG. 7 is a timing diagram of an early read operation after write operation according to an embodiment of the present invention.

FIG. 7 is a timing diagram illustrating a W-R turnaround bubble time BUB using ERAW software 80. The W-R turnaround bubble time BUB has been reduced to approximately 5 ns from 20 ns.

Figure 8:
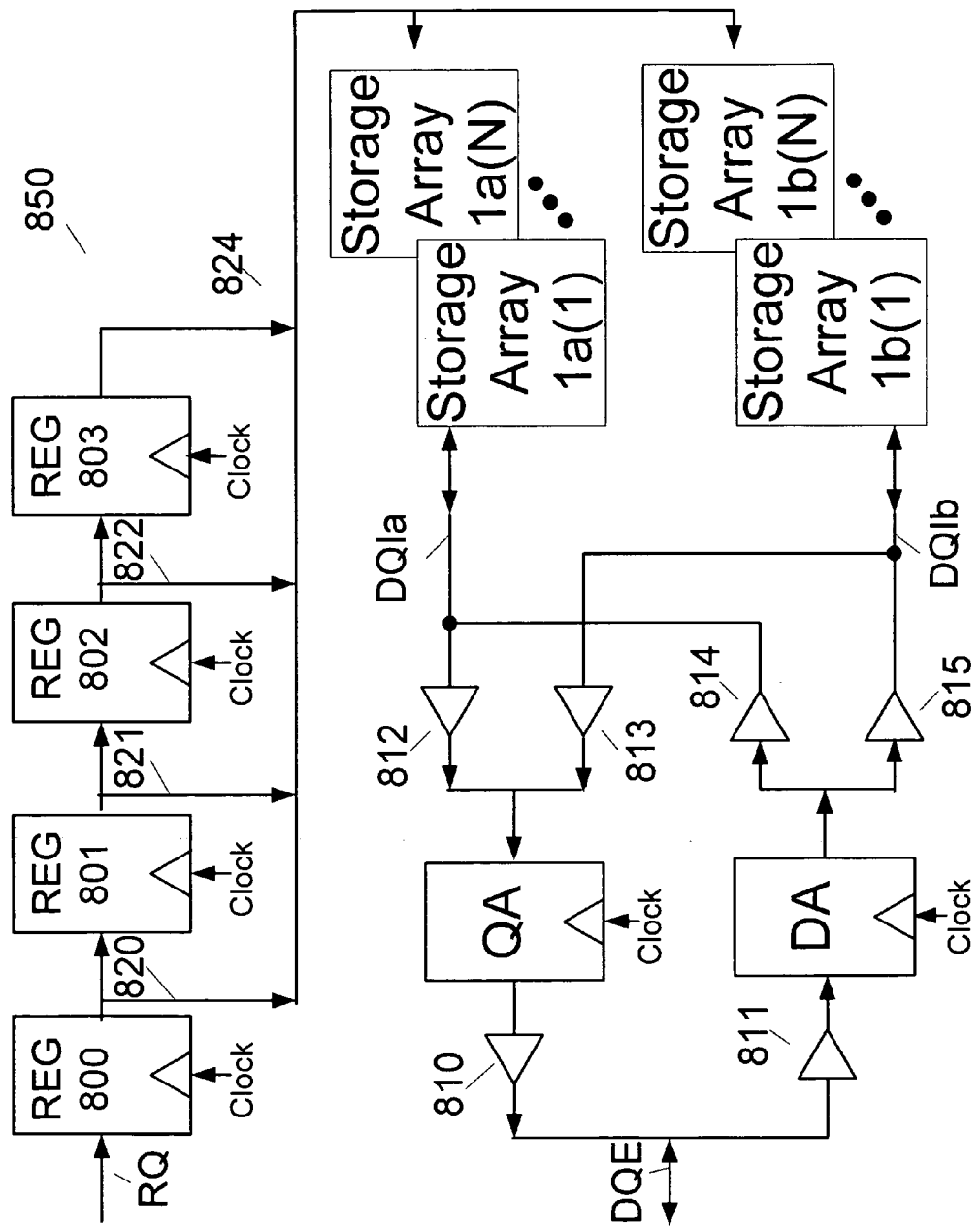
FIG. 8 illustrates a block diagram of a memory device according to an embodiment of the present invention.
Figure 9A:
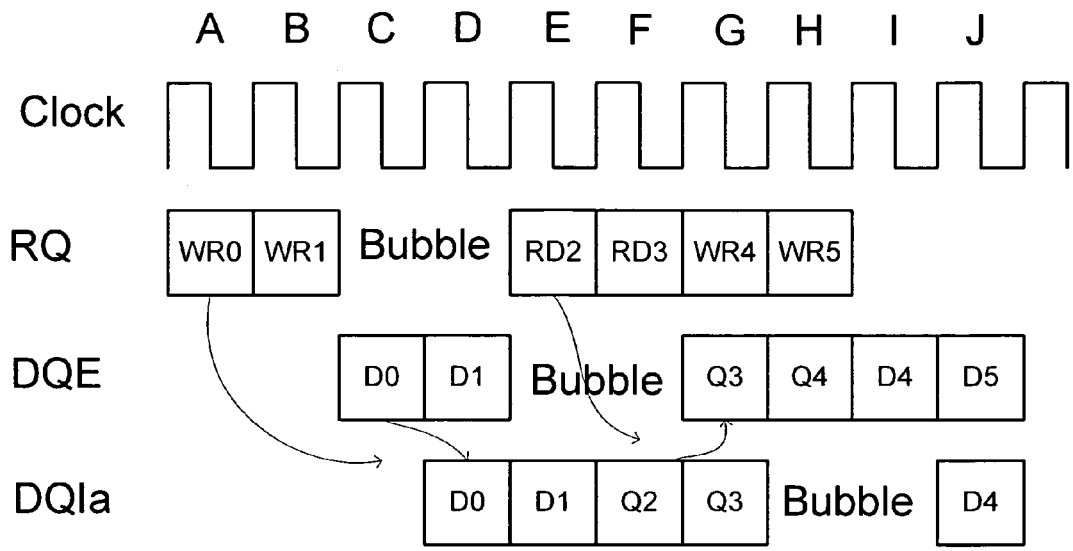
FIG. 9*a* is a timing diagram of a typical memory device.
Figure 9B:
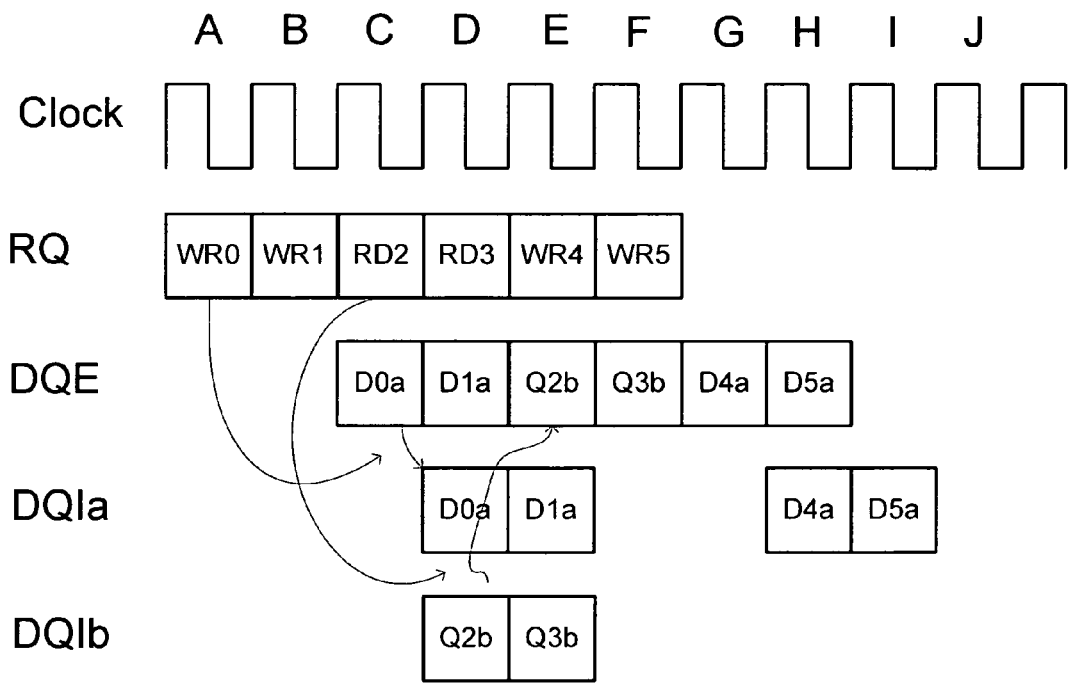
FIG. 9*b* is a timing diagram of the memory device shown in FIG. 8.

FIGS. 8 and 9 illustrate another embodiment of the present invention. FIG. 8 illustrates a block diagram of a memory device 850 in an embodiment of the present invention and FIG. 9b illustrates a timing diagram of memory device 850 shown in FIG. 8. In an embodiment of the present invention, memory device 850 corresponds to memory device 20(1) and, RQ and DQE interfaces connect to interconnect structure 60 shown in FIG. 1.

Memory device 850 is coupled to an interface RQ that is sampled and held by a register 800. In an embodiment of the present invention, interface RQ transfers a command to register 800. In alternate embodiments, multiple registers 800-803 are used to delay asserting a command on lines 820, 821, 822, 823, and 824. These delayed commands are decoded to provide control signals that enable read and write data to move between the DQE interface and the storage arrays. A second interface DQE transfers data to an input of register DA and interface DQE is driven during a read operation by the output of register QA. In an embodiment of the present invention, buffers 810-815 are used at the outputs and inputs of registers QA and DA, and are conditionally enabled to transfer read or write data from one point to another. Registers QA and DA, like registers 800-803, are controlled by a clock signal. In an embodiment of the present invention, register DA drives write data through an internal interconnect structure DQIa to a set of storage arrays 1a(1) through 1a(N), or the set of storage arrays 1a(1) through storage arrays 1a(N) drive read data through an internal interconnect structure DQIa to register QA. In a clock cycle, interface DQE and interconnect structure DQIa may either hold read data or write data, but not typically both.

This constraint produces a resource conflict. This conflict is usually present in a pipelined device or system in which two bidirectional interconnects are separated by a pipeline register. FIG. 9a shows a timing diagram of a typical read after write operation of a typical memory device that illustrates the result of this resource conflict or a bubble.

Clock cycles are labeled "A" through "J". A command sequence of two WRITEs, two READs, and two WRITEs is directed to memory device 850. These are denoted as "WR0, WR1, RD2, RD3, WR4, and WR5", respectively, on the RQ interface. For reasons described below, there is a two cycle gap (cycles C and D) between a WR1 command and a RD2 command, labeled as a "Bubble."

A WR0 command is provided on a RQ interface during cycle A. A WR0 command causes write data D0 that is present on a DQE interface in cycle C to be sampled by a register DA and driven onto interconnect structure DQIa during cycle D. Data D0 is written to the storage arrays during cycle D. A WR0 command that is sampled at an end of cycle A is held during cycles B, C, and D so that the appropriate drive enable signals and register load enable signals can be asserted at the correct time. Control logic for generating the appropriate enable signals is known by one of ordinary skill in the art and in not shown in order to clearly show the present embodiment of the present invention.

A RD2 command is provided on a RQ interface during cycle E. A RD2 command causes one of the storage arrays to be accessed in cycle F, and read data to be driven onto an internal interconnect structure DQIa. This read data is sampled by register QA and driven onto interface DQE during cycle G. The RD2 command that is sampled at the end of cycle E is held during cycles F and G so that the appropriate drive enable signals and register load enable signals can be asserted at the correct time. Control logic for generating the appropriate enable signals is known by one of ordinary skill in the art and in not shown in order to clearly show the present embodiment of the present invention.

The timing used for a READ command produces read data at the earliest possible time as shown in FIG. 9a (one cycle for receiving the command, one cycle for the access, and one cycle for driving the data). Read data is provided on interface DQE two cycles after a READ command is provided on interface RQ.

The timing for a WRITE command has been artificially delayed so write data on interface DQE is also provided two cycles after a WRITE command is provided on interface RQ. Other alignments are possible, but this alignment has an advantage of simplifying an assignment of timing slots on interfaces RQ and DQE; when a command is placed in a timing slot on a interface RQ, there is a corresponding timing slot available on interface DQE.

However, read and write operations use two shared resources; interface DQE and interconnect structure DQIa. Interconnect structure DQIa is used at different times relative to a command on a interface RQ for two operations (unlike interface DQE). Interconnect structure DQIa is used three cycles after a WRITE command on a interface RQ, and one cycle after a READ command.

Because this shared resource is used at different relative times, a two-cycle bubble (cycles C and D) is introduced between WR1 and RD2 commands on a interface RQ. This bubble is shifted two cycles E and F on a interface DQE, and on cycles H and I on interconnect structure DQIa. If read and write operations used different timing sequences, a bubble would be shifted, but would still be present as a WR-WR-RD-RD-WR-WR command sequence is executed.

Some systems may require additional cycles on an external interface DQE when a controller changes between transmitting and receiving. This is not shown in FIG. 9a, but the bubble(s) created by this changing between transmitting and receiving constraint would be added to the two-cycle bubble described above.

A two-cycle bubble represents a performance loss to a system; a memory device is unable to execute any command in the two timing slots. However, it is possible to recover these two timing slots in an embodiment of the present invention.

FIG. 8 shows a second internal interconnect structure DQIb that connects registers QA and DA to a second set of storage arrays 1b(1) through storage arrays 1b(N). In an embodiment of the present invention, a second internal interconnect structure DQIb is added at a very low incremental cost if the existing storage arrays are divided into two groups with half as many as before. In an alternate embodiment of the present invention, each existing storage array could be divided into two halves, with each half connected to its own internal interconnect structure.

Because there are two mutually exclusive resources for each READ or WRITE command to request in each cycle, a two-cycle bubble shown in FIG. 9a is eliminated as shown in FIG. 9b. A "WR0, WR1, RD2, RD3, WR4, and WR5" command sequence is asserted on interface RQ as shown in FIG. 9b. In an embodiment of the present invention, a WRITE command is directed to a storage array set "a" and a READ command are directed to storage array set "b". A RD2 command is proved in a timing slot immediately after a WR1 command. As FIG. 9b shows, two internal interconnects provide D0a and Q2b data to be substantially simultaneously provided on interconnect structures DQIa and DQIb, respectively. In an embodiment of the present invention, a first period of time for transferring data D0a on interconnect structure DQIa overlaps with a second period of time for transferring data Q2b on interconnect structure DQIb. This is a benefit that results from splitting storage arrays into two sets and giving each is own internal data interconnect structure.

When a WRITE/READ command sequence is directed to the same storage array set, a two-cycle bubble is still present. In an embodiment of the present invention, a memory controller adjusts the order in which commands are transmitted to a memory device 850 in order to eliminate a two-cycle bubble.

In an embodiment of the present invention, a memory controller maintains two queues of WRITE commands (and write data), one for each of the two storage array sets in ERAW software 80. When a READ command is directed to a first storage array set, a memory controller transmits a WRITE command to a second storage array set, and vice versa. Typically, it is not a performance issue to delay a WRITE command, as long as a memory controller checks a particular write queue to make sure asserting a subsequent READ command will not attempt to perform a read operation at an address which has a pending write operation.

In an alternate embodiment of the present invention, a bandwidth of external interface DQE (number of signals times the signaling rate) is substantially equal to a bandwidth of interconnect structure DQIa or a bandwidth of interconnect structure DQIb.

In an alternate embodiment of the present invention, a bandwidth of external interface DQE does not equal a bandwidth of interconnect structure DQIa or a bandwidth of interconnect structure DQIb.

In an alternate embodiment of the present invention, two external interfaces DQEa and DQEb are selectively coupled to either DQIa or DQIb. In an embodiment of the present invention, the bandwidth of DQEa, DQEb, DQIa and DQIb are substantially equal. Thus, certain memory sections operate with lockstep (parallel) access and other memory sections operate with half size independent access.

In an embodiment of the present invention, a memory controller generates a command to selectively couple external interfaces to internal interconnect structures. In still another alternate embodiment of the present invention, external interface DQEa is used for reads and external interface DQEb is used for writes. In yet another embodiment of the present invention, external interfaces DQEa and DQEb are both used for a parallel read or write operation.

In an embodiment of the present invention, additional registers are added to registers DA and QA so that data flowing in either direction is delayed to increase the efficiency of the turnaround of an external interface between a read and write operation.

As can be appreciated by one of ordinary skill in the art, there are several advantages to using ERAW software 80. First, interface efficiency is improved at minimal incremental memory device cost compared to memory systems that do not have a write buffer or ERAW software 80. Second, memory device cost and master device complexity is generally reduced for memory systems using a write buffer. The amount of improvement depends upon the size/depth of the write buffer and amount of reordering required to achieve similar levels of efficiency. For some master devices that have flexibility in read request addressing or ordering during a W-R transition, there may be minimal incremental complexity required to support ERAW software 80.

The efficiency improvement realized is a function of the rate of resource conflicts between initial reads on a W-R transition and the outstanding writes for the duration of concurrent memory bank access.

Figure 10:
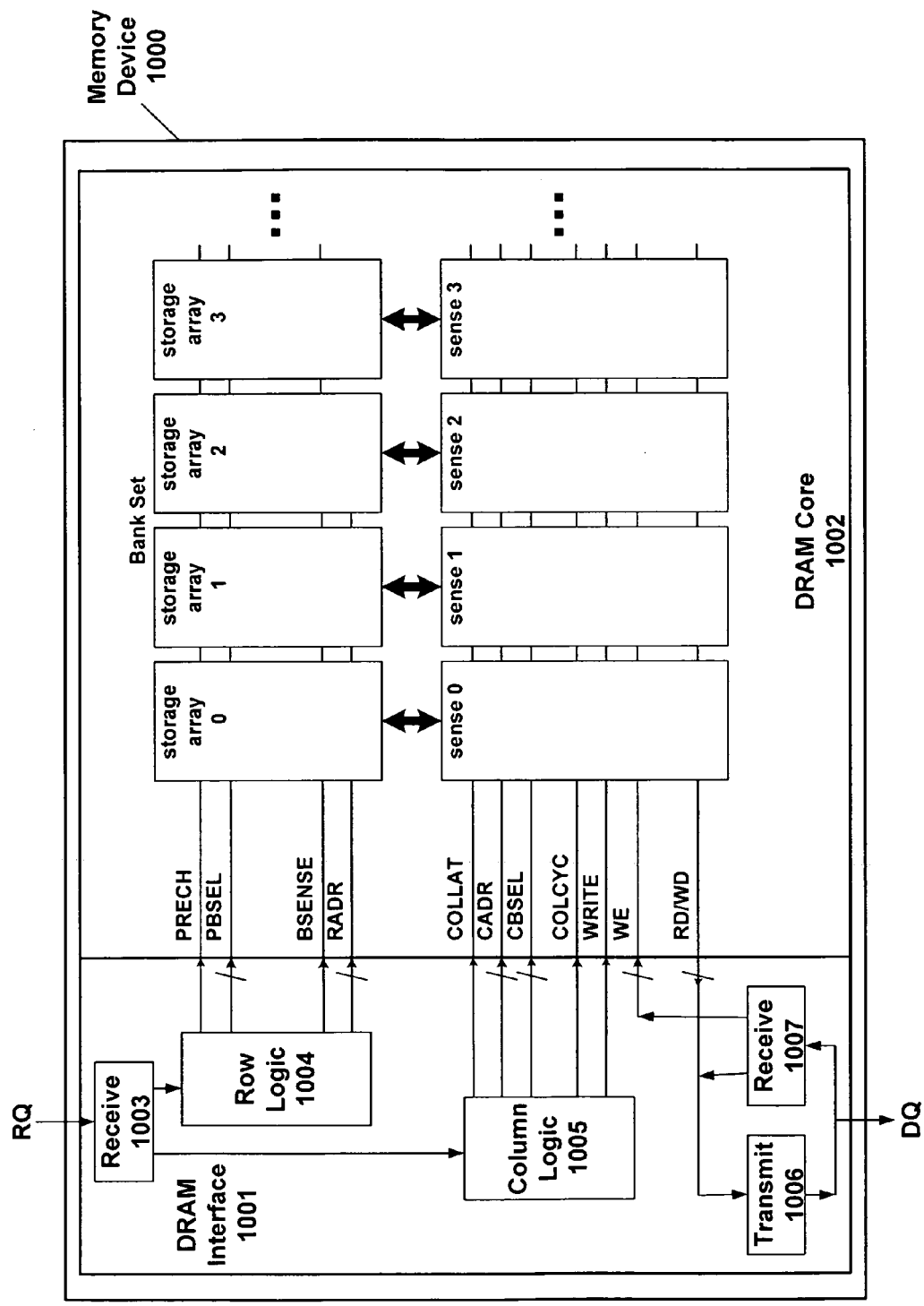
FIG. 10 is a block diagram of a memory device according to an embodiment of the present invention.

FIG. 10 illustrates a memory device 1000 according to an embodiment of the present invention. Memory device 1000 is a DRAM device having a memory core 1002 and memory interface 1001. Memory core 1002 includes a set of memory banks having storage arrays 0-3, with sense amplifiers 0-3 associated with respective storage arrays 0-3. Interface 1001 connects to two sets of external interconnect structures RQ and DQ. A RQ interconnect structure carries request information (command, control and address information) to memory device 1000. A DQ interconnect structure carries data information to and from memory device 1000. Receive logic 1003 is coupled to a DQ interconnect structure and Row logic 1004 and Column logic 1005. Row logic 1004 is coupled to a set of memory banks by PRECH, PBSEL, BSENSE and RADR interconnects. Column logic 1005 is coupled to sense amplifiers by COLLAT, CADR, CBSEL, COLCYC and WRITE interconnects. Transmit logic 1006 and Receive logic 1007 is coupled to a DQ interconnect structure and sense amplifiers. In particular, a RD/WD interconnect is coupled to Transmit logic 1006 and Receive logic 1007. WE interconnect couples Receive logic 1007 to sense amplifiers.

Request information is received and decoded by Receive logic 1003. If a request command initiates a row operation such as an ACTIVATE command ("ACT") or a PRECHARE command ("PRE"), then control and address information is passed to Row logic 1004. If a request command initiates a column operation such as a READ operation ("RD") or a WRITE operation ("WR"), then control and address information is passed to Column logic 1005.

In a case of a precharge operation, a bank address in a request is placed on a PBSEL interconnect, and a PRECH interconnect is pulsed high, with a rising edge causing a selected bank to be precharged (placed into a state so that an activate operation may be performed).

In a case of an activate operation, a bank address and row address in a request is placed on a RADR interconnect, and a BSENSE interconnect is pulsed low, with a falling edge causing a selected row of a selected bank to be activated (the information in a selected row is copied into an associated sense amplifier for a selected bank).

In a case of a read operation, a bank address and column address in a request is placed on CBSEL and CADR interconnects, respectively, and COLLAT and COLCYC interconnects are pulsed high, with rising edges causing a selected column of a sense amplifier of a selected bank to be accessed and driven onto an internal RD/WD interconnect. Transmit logic 1006 takes this read data on an internal RD/WD interconnect and drives it onto an external DQ interconnect structure.

In a case of a write operation, Receive logic 1007 takes write data on an external DQ interconnect structure and drives write data onto internal RD/WD interconnect. Bank address and column address in a request is placed on CBSEL and CADR interconnects, respectively, and COLLAT and COLCYC interconnects are pulsed high, with rising edges causing write data on RD/WD interconnects to be stored in a selected column of a sense amplifier of a selected bank. WE interconnects are used for write mask information. This permits some write data to be stored, and some write data to not be stored (the data in the sense amplifier is not modified in an embodiment of the present invention). Write mask information has approximately the same timing as the write data.

Figure 11:
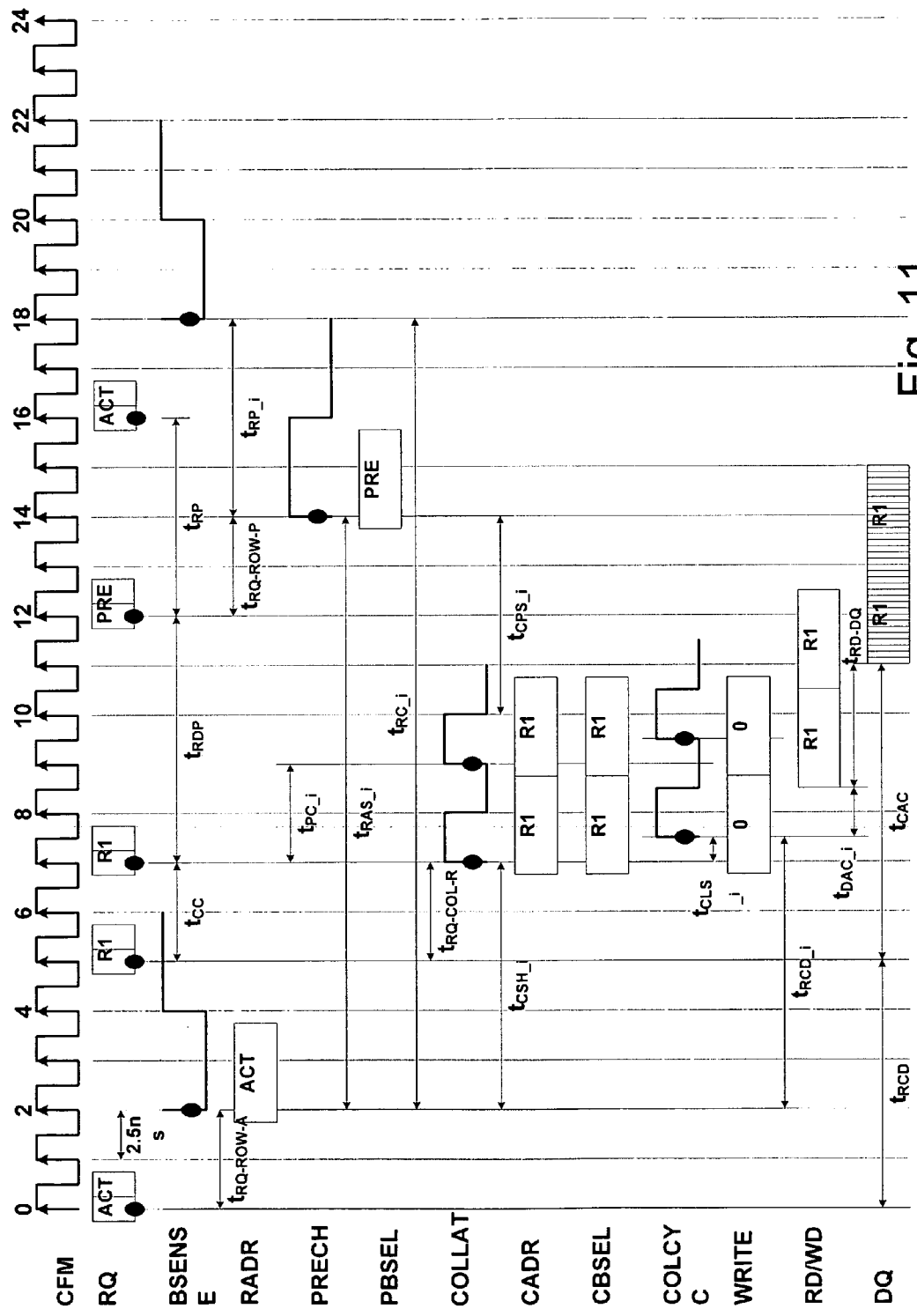
FIGS. 11-13 are timing diagrams illustrating the operation of the memory device shown in FIG. 10.

FIG. 11 is a timing diagram illustrating events on interconnects of memory device 1000 seen in FIG. 10 for a read operation. These timing limits or intervals may constrain minimum time intervals between events on interconnects. These intervals are:

$t_{RQ\text{-}ROW\_A}$ Interval between an ACT command on a RQ interconnect and a falling edge of a signal on a BSENSE interconnect;

$t_{RQ\text{-}ROW\_P}$ Interval between a PRE command on a RQ interconnect and rising edge of a signal on PRECH interconnect;

$t_{RQ\text{-}COL\_R}$ Interval between a RD command on a RQ interconnect and a rising edge of a signal on a COLLAT interconnect;

$t_{RQ\text{-}COL\_W}$ Interval between a WR command on a RQ interconnect and a rising edge of a signal on a COLLAT interconnect;

$t_{RD\text{-}DQ}$ Interval between read data on a RD/ND interconnect and read data on a DQ interconnect;

$t_{DQ\text{-}WD}$ Interval between write data on a DQ interconnect and write data on a RD/WD interconnect;

$t_{RCD}$ Interval between a ACT command on a RQ interconnect and RD or WR command on a RQ interconnect structure;

$t_{CC}$ Interval between two RD commands or two WR commands on a RQ interconnect;

$t_{RR}$ Interval between two ACT commands to different banks on a RQ interconnect;

$t_{RC}$ Interval between two ACT commands to same banks on a RQ interconnect;

$t_{PP}$ Interval between two PRE commands to different banks on a RQ interconnect;

$t_{RC}$ Interval between two PRE commands to same banks on a RQ interconnect;

$t_{RDP}$ Interval between RD command and PRE command on a RQ interconnect;

$t_{WRP}$ Interval between WR command and PRE command on a RQ interconnect;

$t_{CAC}$ Interval between RD command on a RQ interconnect and read data on a DQ interconnect;

$t_{CWD}$ Interval between WR command on a RQ interconnect and write data on a DQ interconnect;

$t_{CSH\_i}$ Interval between a falling edge of a signal on a BSENSE interconnect and a rising edge of a signal on a COLLAT interconnect;

$t_{CLS\_i}$ Interval between a rising edge of a signal on a COLLAT interconnect and rising edge of a signal on a COLCYC interconnect;

$t_{RCD\_i}$ Interval between a falling edge of a signal on a BSENSE interconnect and a rising edge of a signal on a COLCYC interconnect;

$t_{CPS\_i}$ Interval between a falling edge of a signal on a COLLAT interconnect and a rising edge of a signal on a PRECH interconnect;

$t_{PC\_i}$ Interval between a rising edge of a signal on a COLLAT interconnect and next rising edge of a signal on a COLLAT interconnect;

$t_{DAC\_i}$ Interval between a rising edge of a signal on a COLLAT interconnect and valid read data on a RD/WD interconnect;

$t_{RAS\_i}$ Interval between a falling edge of a signal on a BSENSE interconnect and a rising edge of a signal on a PRECH interconnect;

$t_{RP\_i}$ Interval between a rising edge of a signal on a PRECH interconnect and a next falling edge of a signal on a BSENSE interconnect; and, $t_{RC\_i}$ Interval between two falling edges of a signal on a BSENSE interconnect to a same bank.

In an embodiment of the present invention, an occurrence of an event on an interconnect may be constrained by two or more of the above intervals. In an embodiment of the present invention, all applicable time intervals must be satisfied if two or more time intervals apply.

In an embodiment of the present invention, a signal on an interconnect will be set and held around a rising or falling edge of a signal on another interconnect. The amount of time to set and hold a signal ($t_{SET}$ and $t_{HOLD}$ time intervals) is not shown in FIGS. 11-13 and 15. However, the following shows which signals on specific interconnects are used for setting up and holding signals on other interconnects.

A falling edge of a signal on a BSENSE interconnect is used to set and hold a signal on a RADR interconnect. A rising edge of signal on a PRECH interconnect is used to set and hold a signal on a PBSEL interconnect. A rising edge of a signal on a COLLAT interconnect is used to set and hold a signal on CADR and CBSEL interconnects. A rising edge of a signal on a COLCYC interconnect is used to set and hold a signal on WRITE and RD/WD interconnects.

FIG. 11 illustrates reading information from memory device 1000, consisting of four request packets on a RQ interconnect structure. These packets contain an ACT command, a RD command, a RD command, and a PRE command, and cause an activate operation, two read operations, and a precharge operation to occur.

Figure 12:
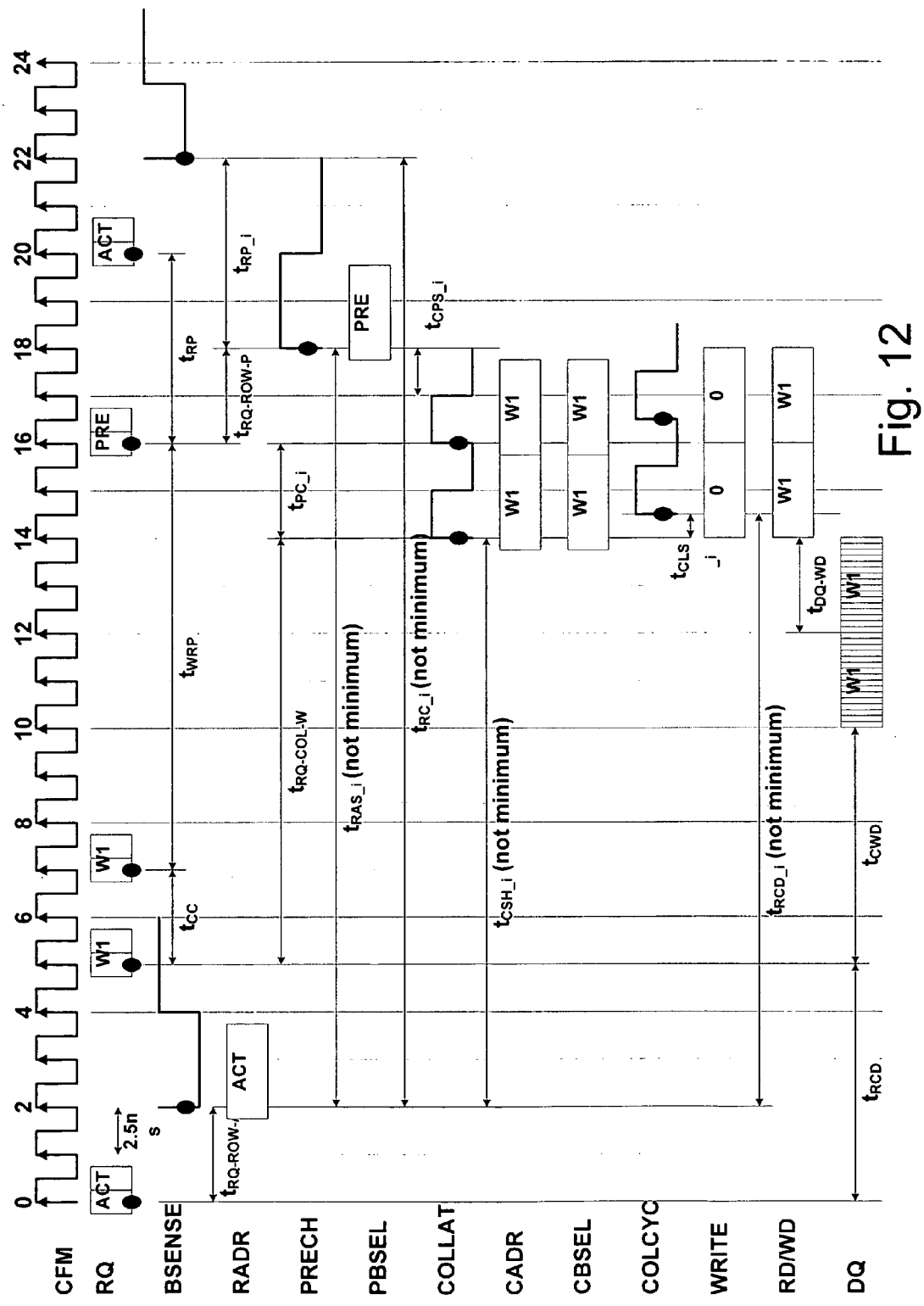

FIG. 12 illustrates writing information to memory device 1000, consisting of four request packets on a RQ interconnect structure. These packets contain an ACT command, a first WR command, a second WR command, and a PRE command, and cause an activate operation, two write operations, and a precharge operation to occur.

FIGS. 11 and 12 illustrate the position of read data and write data on both an internal RD/WD interconnect and on the external DQ interconnect structure. Read data and write data share the same physical wires both inside and outside memory device 1000. However, the relative times at which read data and write data occupy these wires are different (relative to the RD and WR commands).

Figure 13:
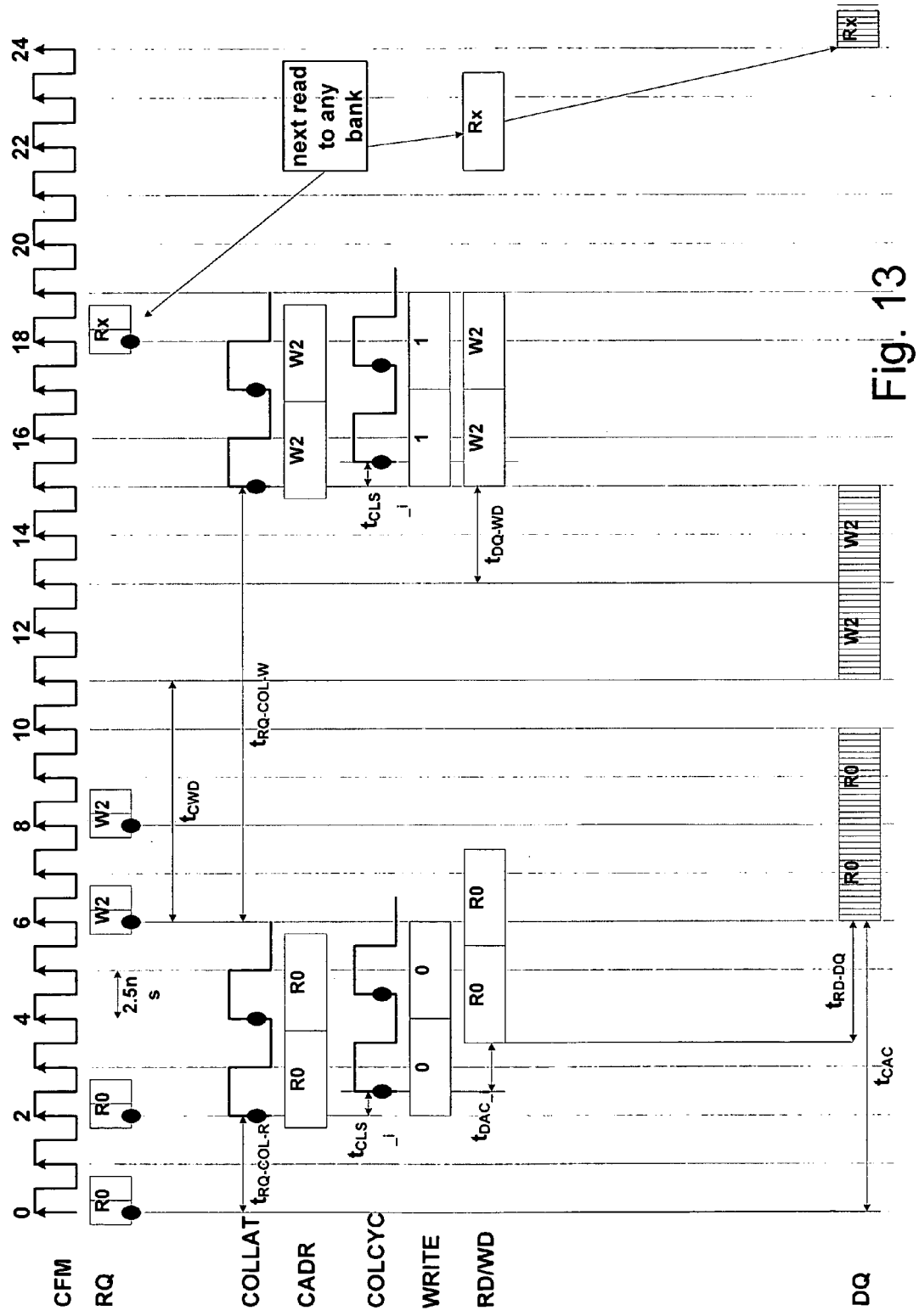

FIG. 13 illustrates a sequence of read and write commands (RD-RD-WR-WR-RD) applied to memory device 1000. In order to clearly illustrate an embodiment of the present invention, ACTIVATE and PRECHARGE commands (ACT and PRE) are not shown in FIG. 13 because they will not affect the spacing of READ and WRITE commands.

Two read commands are issued to bank 0 at clock from master ("CFM") edges 0 and 2. This results in read data R0 appearing on a RD/WD interconnect during CFM rising edges 4 through 7, and on a DQ interconnect structure between CFM edges 6 through 10.

Two write commands are issued to storage array 2 at CFM rising edges 6 and 8. This allows write data W2 to be accepted on a DQ interconnect structure between CFM rising edges 11 thorough 15, and to be accepted on a RD/WD interconnect between CFM rising edges 15 through 19.

This provides for a one CFM cycle gap between read and write data on a DQ interconnect structure (between CFM rising edges 10 and 11) to ensure that the two sets of driver circuitry (on memory device 1000 and on a master device, such as an external controller) may turn off and turn on without overlapping.

Internal logic for driving a RD/WD interconnect requires a similar turnaround gap, however it must be larger—two CFM cycles in an embodiment of the present invention. This is met in the read-to-write direction.

A third read command Rx is issued to a bank "x" that is different from storage array 0 and storage array 2 that avoids a bank contention. Read command Rx is issued at CFM rising edge 18 or later to insure that there is at least a two cycle turnaround gap on a RD/WD interconnect between an end of a W2 write data and a beginning of a Rx read data.

As a result, there is a 9 CFM cycle gap between read and write data on a DQ interconnect structure, larger than one cycle required for a turnaround gap. This will reduce the performance of memory device 1000 in an embodiment of the present invention.

Figure 14:
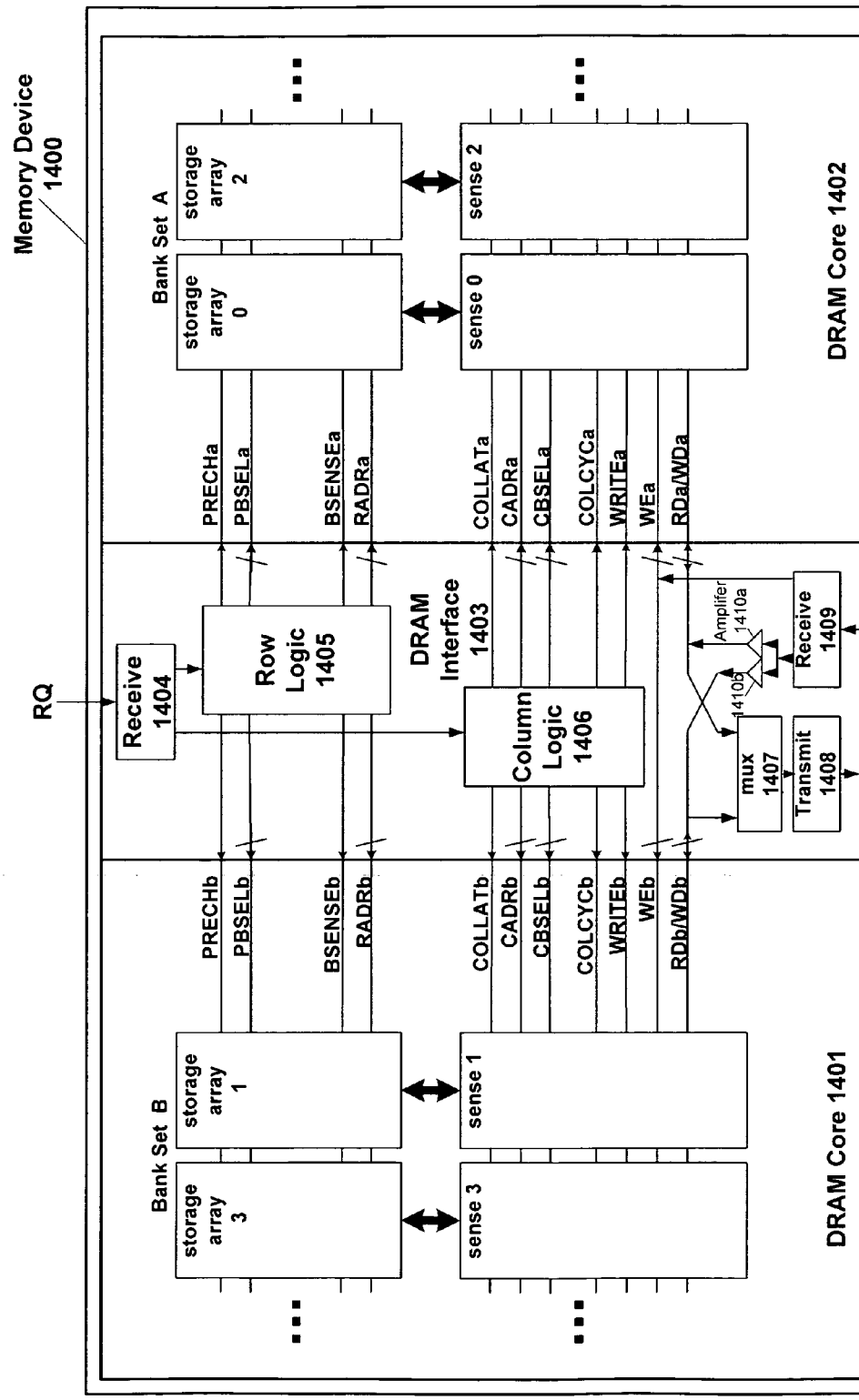
FIG. 14 is a block diagram of a memory device according to an embodiment of the present invention.

FIG. 14 shows how this performance loss can be avoided with a memory device 1400 having split banks. In an embodiment of the present invention, memory device 1400 is a DRAM having interface circuitry 1403 coupled to DRAM core 1401 and 1402. In an embodiment of the present invention, DRAM core 1401 includes a memory bank set B having storage arrays and associated sense amplifies, and DRAM core 1402 includes a memory bank set A having storage arrays and associated sense amplifiers. Even banks are in bank set A and the odd banks are in bank set B in an embodiment of the present invention. Each memory bank set will have a set of interconnects for communicating with interface circuitry 1403 (the letters "a" and "b" are appended to each interconnect).

Interface circuitry 1403 includes Receive logic 1404 coupled to a RQ interconnect structure, and Transmit logic 1408 and Receive logic 1409 coupled to a DQ interconnect structure. Receive logic 1404 is coupled to Row logic 1405 and Column logic 1406. Transmit logic 1408 is coupled to multiplexer (mux) 1407. Multiplexer 1407 selects read data from a particular bank set in response to a bank address bit. Receive logic 1409 is coupled to amplifiers 1410*a-b* driving interconnects RDa/WDa, RDb/WDb, WEa and WEb. In an embodiment of the present invention, only one of amplifiers 1410*a* or 1410*b* is enabled in response to bank address bit.

Interface circuitry 1403 drives two sets of interconnects. Row logic 1405 is coupled to memory bank set A by PRECHa, PBSELa, BSENSEa and RADRa interconnects and coupled to memory bank set B by PRECHb, PBSELb, BSENSEb and RADRb interconnects. Similarly, Column logic 1406 is coupled to memory bank set A by COLLATa, CADRa, CBSELa, COLCYCa, and WRITEa interconnects and coupled to memory bank set B by COLLATb, CADRb, CBSELb, COLCYCb, and WRITEb interconnects. WEa and WEb interconnects are coupled to Receive logic 1409. Amplifier 1410*a* is coupled to Receive logic 1409 and RDa/WDa interconnect. Amplifier 1410*b* is coupled to Receive logic 1409 and RDb/WDb interconnect. Interface circuitry 1403 select read data from the RDa/WDa and RDb/WDb interconnects using a multiplexing 1407. This represents a very slight overhead in circuit area, but provides a way for reducing a write-read gap described above.

Figure 15:
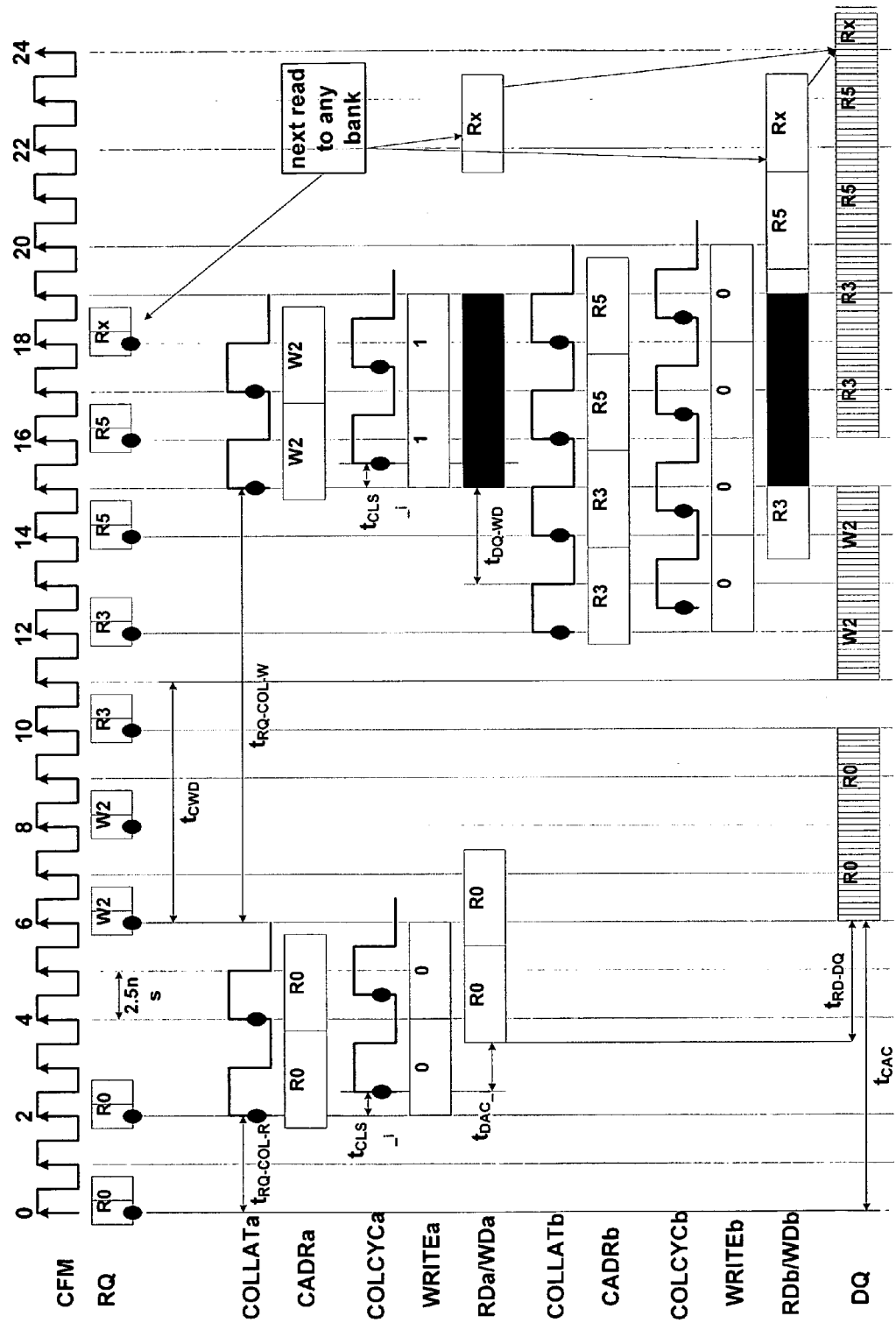
FIG. 15 is a timing diagram illustrating the operation of the memory device shown in FIG. 14.

FIG. 15 illustrates a timing and operation of memory device 1400 having split memory banks. Two sets of RD/WD interconnects allows for write data to be sent on RDa/WDa to even banks to be stored and a RDb/WDb interconnect is available for read data from odd banks.

Thus, read commands to odd storage arrays 3 and 5 are provided at CFM cycles 10, 12, 14, and 16. This causes read data R3 and R5 to appear on RDb/WDb interconnects during CFM rising edges 14 through 21, and on a DQ interconnect structure between CFM edges 16 through 24.

In this embodiment of the present invention, a one CFM cycle gap between write and read data on a DQ interconnect structure (between CFM rising edges 15 and 16) is formed to ensure that the two sets of driver circuitry (on a memory device and on a master device, such as a controller) may turn off and turn on without overlapping.

A third read command Rx is issued to a bank "x" that is different from storage arrays 0, 2, 3, and 5 that avoids a bank contention. Read command Rx is issued at CFM rising edge 18 or later to insure that there is at least a two cycle turnaround gap on RDa/WDa interconnects between an end of write data W2 and a beginning of read data Rx. Bank "x" may be even or odd (subject to a bank contention restriction), since there will be no turnaround issue on a RDb/WDb interconnect between R5 read data and Rx read data, if "x" is odd.

As a result, a write-read gap on a DQ interconnect structure has been reduced to one CFM cycle, a minimum for driver circuitry turnaround in an embodiment of the present invention. Four read commands are issued immediately after two write commands to a bank set not being used by the write commands in an embodiment of the present invention.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A memory controller, comprising:
    an interface;
    a circuit to output write data and a write address to a first storage array in a memory device and a read address to a second storage array in the memory device,
    a first storage circuit to a store a first plurality of commands for the first storage array; and
    a second storage circuit to store a second plurality of commands for the second storage array;
    wherein the memory controller outputs a first command from the first plurality of commands to the first storage array when a second command from the second plurality of commands is output to the second storage array,
    wherein the first command initiates storing the write data in the first storage array and the second command initiates accessing read data from the second storage array,
    wherein the write data and write address are output at the interface during a first period of time and the read address is output at the interface during a second period of time, wherein the second period of time is immediately after the first period of time.

2. The memory controller of claim 1, wherein the write data is output at a first interface portion of the interface and the write address is output at a second interface portion of the interface, wherein the read data is received at the first interface portion.

3. The memory controller of claim 1, wherein the first period of time is a first clock cycle of a clock signal and the second period of time is a second clock cycle of the clock signal.

4. The memory controller of claim 1, wherein the write data is provided at a first edge of a clock signal and the read data is received at a second edge of the clock signal.

5. The memory controller of claim 1, wherein the write data and write address have an associated first command and the read address has an associated second command.

6. The memory controller of claim 1, wherein the write address includes a colunm address and a row address identifying a row of memory cells in the first storage array to store the write data.

7. The memory controller of claim 1, wherein the first storage array is in a first memory bank and the second storage array is in a second memory bank.

8. The memory controller of claim 1, wherein the interface is configured to couple to an external interconnect, wherein the memory controller outputs control information to the memory device to selectively couple the external interconnect to one of first and second internal interconnects of the memory device, wherein the first internal interconnect is coupled to the first storage array and the second internal interconnect is coupled to the second storage array.

9. A method of operating a memory controller, the method comprising:
   outputting a first command to initiate a write operation of a first storage array in a memory device;
   outputting write data along with the first command, wherein the write data is associated with the first command;
   outputting a second command to initiate a read operation of a second storage array in the memory device,
   obtaining the first command from a first plurality of commands stored in a first storage circuit, the first plurality of commands indicating a plurality of write operations; and
   obtaining the second command from a second plurality of commands stored in a second storage circuit, the second plurality of commands indicating a plurality of read operations,
   wherein the second command is provided immediately after the first command.

10. The method of claim 9, further comprising:
   outputting a write address along with the first command; and
   outputting a read address along with the second command.

11. The method of claim 10, wherein the write address includes a colunm address and a row address identifying a row of memory cells in the first storage array to store the write data, and the read address includes a column address and a row address identifying a row of memory cells to access in the second storage array.

12. The method of claim 9, wherein the outputting the first command occurs during a first clock cycle of a clock signal and the outputting the second command occurs during a second clock cycle of the clock signal.

13. The method of claim 9, further comprising:
   outputting a control signal to selectively couple an interface of the memory controller to one of first and second internal interconnects of the memory device, the first internal interconnect coupled to the first storage array and the second internal interconnect coupled to the second storage array.

14. The method of claim 13, wherein the first storage array is included in a first memory bank and the second storage array is included in a second memory bank, and the control signal includes information identifying a selected memory bank.

15. The method of claim 14, wherein the interface of the memory controller is coupled to a first external interconnect to transfer address information, wherein the interface of the memory controller is coupled to a second external interconnect to transfer data, and wherein the control signal is included in the address information.

16. A method of operating a memory controller having a first interface portion and a second interface portion, the method comprising:
   obtaining first control information from a plurality of control information stored in a first storage circuit;
   during a first period of time and at the first interface portion, outputting the first control information that specifies storage of write data in a first storage array of a memory device;
   obtaining second control information from a plurality of control information stored in a second storage circuit;
   during a second period of time and at the first interface portion, outputting the second control information that specifies access of read data from a second storage array of the memory device, wherein the second period of time is immediately after the first period of time;
   during a third period of time and at the second interface portion, outputting the write data to the first storage array of the memory device; and
   receiving the read data from the second storage array of the memory device.

17. The method of claim 16, wherein the first control information that specifies storage of write data includes an address of the first storage array to store the write data, and wherein the second control information that specifies access of read data includes an address of the second storage array to access the read data.

18. The method of claim 16, wherein the first period of time is a first clock cycle of a clock signal and the second period of time is a second clock cycle of the clock signal.

19. The method of claim 18, wherein the clock signal is provided by the memory controller.

20. The method of claim 18, wherein the first control information that specifies the storage of write data includes address information of a memory bank, wherein the first storage array is included in a first memory bank coupled to a first interconnect of the memory device, and wherein the second storage array is included in a second memory bank coupled to a second interconnect of the memory device.

21. The method of claim 20, wherein the second interface portion is selectively coupled to one of the first and second internal interconnects in response to the address information of the memory bank.

22. The method of claim 16, wherein the memory device includes a first interconnect coupled to the first storage array and a second interconnect coupled to the second storage array, further comprising:
   outputting a command to the memory device so that one of the first and second interface portions is selectively coupled to one of the first and second interconnects.

* * * * *